(12) United States Patent  
Moon et al.

(10) Patent No.: US 11,243,255 B2  
(45) Date of Patent: Feb. 8, 2022

(54) ELECTRONIC DEVICE FOR DETERMINING STATE OF CHARGE OF BATTERY DEVICE, AND METHOD OF OPERATING THE ELECTRONIC DEVICE

(71) Applicant: SAMSUNG ELECTRONICS CO., LTD., Suwon-si (KR)

(72) Inventors: Sangbin Moon, Suwon-si (KR); Hyoungseok Oh, Suwon-si (KR); Sungwoo Lee, Suwon-si (KR); Jungwook Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 101 days.

(21) Appl. No.: 16/705,467

(22) Filed: Dec. 6, 2019

(65) Prior Publication Data

US 2020/0284841 A1 Sep. 10, 2020

(30) Foreign Application Priority Data

Mar. 8, 2019 (KR) .......................... 1020190027014

(51) Int. Cl.
*G01R 31/364* (2019.01)
*G01R 31/36* (2020.01)
(Continued)

(52) U.S. Cl.
CPC ....... *G01R 31/364* (2019.01); *G01R 31/3648* (2013.01); *G01R 31/389* (2019.01); *G01R 31/3842* (2019.01)

(58) Field of Classification Search
None
See application file for complete search history.

(56) References Cited

U.S. PATENT DOCUMENTS 6,020,718 A 2/2000 Ozawa et al.
6,329,792 B1 * 12/2001 Dunn ................... G01R 31/396
320/132

(Continued)

FOREIGN PATENT DOCUMENTS

JP 2004311308 A 11/2004
JP 2011172415 A 9/2011
JP 2018057137 A 4/2018

*Primary Examiner* — Jas A Sanghera
(74) *Attorney, Agent, or Firm* — Volentine, Whitt & Francos, PLLC

(57) ABSTRACT

A battery device includes a first battery and a second battery connected in series. An electronic device for determining a state of charge of the battery device includes a sense resistor connected in series to the second battery, and a fuel gauge. The fuel gauge is configured to determine the state of charge of the battery device based on a first terminal voltage of the first battery, a first calculation current of the first battery, a second terminal voltage of the second battery, and a measurement current of the second battery measured through the sense resistor. The fuel gauge calculates a second calculation current of the second battery using a battery parameter of an equivalent circuit model, corrects the battery parameter when a difference between the measurement current and the second calculation current is not less than a threshold value, and calculates the first calculation current using the battery parameter or a corrected battery parameter.

20 Claims, 20 Drawing Sheets

(51) Int. Cl.
*G01R 31/3842* (2019.01)
*G01R 31/389* (2019.01)

(56) References Cited

U.S. PATENT DOCUMENTS

| | | | |
|---|---|---|---|
| 6,486,635 B1* | 11/2002 | Matsuda | G01R 31/396 320/134 |
| 8,766,597 B2 | 7/2014 | Nork et al. | |
| 2013/0342214 A1* | 12/2013 | Lin | G01R 31/396 324/434 |
| 2017/0045587 A1 | 2/2017 | Kim et al. | |
| 2017/0244258 A1 | 8/2017 | Yao | |
| 2018/0226810 A1 | 8/2018 | Barsukov et al. | |
| 2019/0157896 A1* | 5/2019 | Cha | H02J 7/00714 |

\* cited by examiner $$V_{OC} = V + IR_{int}$$

$$I = \frac{V_{OC} - V}{R_{int}}$$

$$V_{OC} = V + V_{RLC} + IR_{int}$$

$$I = \frac{V_{OC} - V - V_{RLC}}{R_{int}}$$

$$V_{OC} = V + V_{TH} + IR_{int}$$

$$I = \frac{V_{OC} - V - V_{TH}}{R_{int}}$$

ELECTRONIC DEVICE FOR DETERMINING STATE OF CHARGE OF BATTERY DEVICE, AND METHOD OF OPERATING THE ELECTRONIC DEVICE

CROSS-REFERENCE TO RELATED APPLICATION

This U.S. non-provisional patent application claims the benefit of priority under 35 U.S.C. § 119 to Korean Patent Application No. 10-2019-0027014, filed on Mar. 8, 2019 in the Korean Intellectual Property Office, the disclosure of which is incorporated herein in its entirety by reference.

BACKGROUND

1. Technical Field

The present disclosure relates to an electronic device. More particularly, the present disclosure relates to an electronic device for determining a state of charge of a battery device and a method of operating the electronic device.

2. Description of the Related Art

Portable electronic devices such as mobile phones include batteries. As the fifth generation (5G) era for cellular network technology has arrived, the power required by mobile phones has increased. Since a usage time of 5G mobile phones is limited due to the current battery capacity, increased capacity of the battery is increasingly demanded. Accordingly, the importance of fast charging of the battery of the mobile phones has also increased. Since it is difficult to measure energy actually stored in the battery, the state of charge (SOC) of the battery may be used as a parameter (e.g., a basis) for measuring energy available in the battery.

SUMMARY

According to aspects of the present disclosure, an electronic device and a method of operating the electronic device are provided. A state of charge of a battery device can be efficiently determined with the electronic device and the method of operating the electronic device.

According to another aspect of the present disclosure, a battery device capable of efficiently determining a state of charge of the battery device is provided.

According to an aspect of the present disclosure, a battery device includes a first battery and a second battery connected in series. An electronic device is provided for determining a state of charge of the battery device. The electronic device includes a sense resistor and a fuel gauge. A measurement current of the second battery is measured through the sense resistor. The sense resister is configured to be connected in series to the second battery. The fuel gauge is configured to determine the state of charge of the battery device based on a first terminal voltage of the first battery, a first calculation current of the first battery, a second terminal voltage of the second battery, and the measurement current of the second battery. The fuel gauge is further configured to calculate a second calculation current of the second battery by using a first battery parameter of an equivalent circuit model of the second battery and the second terminal voltage. The fuel gauge is also configured to correct the first battery parameter to a second battery parameter when a difference between the measurement current and the second calculation current is greater than or equal to a threshold value, and to calculate the first calculation current by using the first terminal voltage and the first battery parameter or the second battery parameter.

According to another aspect of the present disclosure, a battery device includes a first battery and a second battery connected in series. A method of operating an electronic device for determining a state of charge of the battery device includes obtaining a measurement current of the second battery, measured through a sense resistor serially connected to the second battery, and calculating a calculation current of the second battery by using a first battery parameter of an equivalent circuit model of the second battery and a second terminal voltage of the second battery. The method of operating the electronic device also includes correcting the first battery parameter to a second battery parameter when a difference between the measurement current and the calculation current is greater than or equal to a threshold value, and calculating a current of the first battery by using the first terminal voltage of the first battery and the first battery parameter or the second battery parameter. The state of charge of the battery device is determined based on the current of the first battery and the measurement current of the second battery or the calculation current of the second battery.

According to another aspect of the present disclosure, a battery device is connectable to an electronic device and includes a first battery and a second battery connected in series, a first terminal connected to a high voltage node of the first battery, a second terminal connected to a connection node between the first battery and the second battery, and a third terminal connected to a low voltage node of the second battery. The battery device is configured to receive a first charging current from the electronic device through the first terminal in a first charge mode, receive a second charging current from the electronic device through the second terminal in a second charge mode, and provide a system current to the electronic device through the second terminal in a discharge mode.

BRIEF DESCRIPTION OF THE DRAWINGS

Embodiments of the inventive concept(s) of the present disclosure will be more clearly understood from the following detailed description taken in conjunction with the accompanying drawings in which.

DETAILED DESCRIPTION OF THE EMBODIMENTS

Hereinafter, embodiments of the inventive concept(s) of the present disclosure are described in detail with reference to the accompanying drawings.

Figure 1:
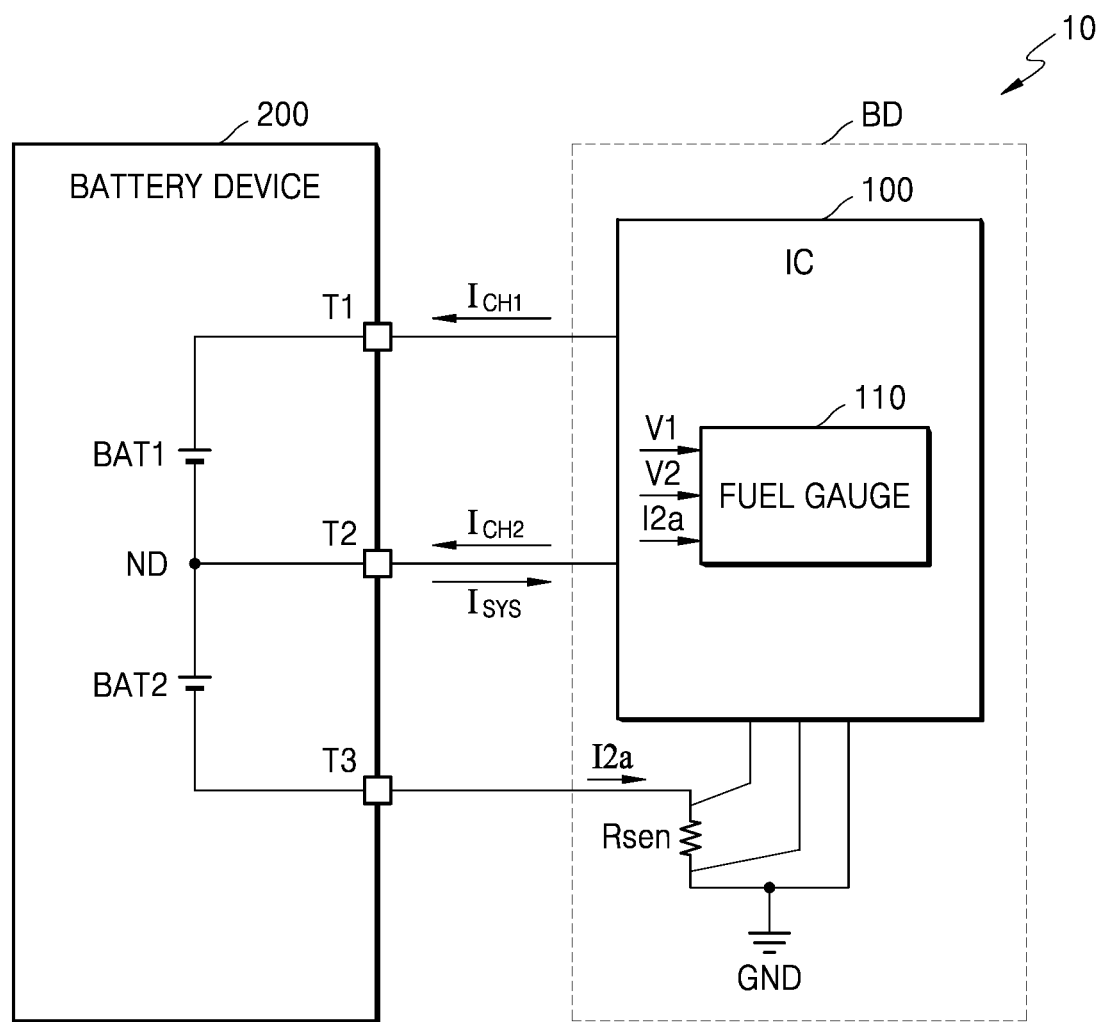
FIG. 1 is a block diagram illustrating an electronic device according to an embodiment.

FIG. 1 is a block diagram illustrating an electronic device 10 according to an embodiment.

Referring to FIG. 1, the electronic device 10 may include a battery device 200. In an embodiment, the battery device 200 may be embedded in the electronic device 10. In an embodiment, the battery device 200 may be detachable from the electronic device 10. For example, the electronic device 10 may include a smart phone, a tablet personal computer (PC), a mobile phone, a personal digital assistant (PDA), a laptop, a wearable device, a global positioning system (GPS), and a mobile device such as an electronic book terminal, a digital broadcasting terminal, an MP3 player, and a digital camera. For example, the electronic device 10 may be an electric vehicle.

The battery device 200 may include a first battery BAT1 and a second battery BAT2 connected to each other in series. In addition, the battery device 200 may further include a first terminal T1, a second terminal T2, and a third terminal T3. Accordingly, the battery device 200 may be a 3-terminal battery. The first battery BAT1 may have a cathode or positive side and an anode or negative side. The second battery BAT2 may have a cathode or positive side and an anode or negative side. The first terminal T1 may be connected to a high voltage node of the first battery BAT1, the second terminal T2 may be connected to a connection node ND between the first battery BAT1 and the second battery BAT2, and the third terminal T3 may be connected to a low voltage node of the second battery BAT2. The high voltage node of the first battery BAT1 may be the cathode or positive side of the first battery BAT1. The low voltage node of the second battery BAT2 may be the anode or negative side of the second battery BAT2.

The battery device 200 may receive a first charging current $I_{CH1}$ through the first terminal T1 in a first charge mode and may receive a second charging current $I_{CH2}$ through the second terminal T2 in a second charge mode. The battery device 200 may provide a system current $I_{SYS}$ through the second terminal T2 in a discharge mode or a battery only mode. Accordingly, the first terminal T1 may be referred to as a "charging terminal" and used to charge the first battery BAT1, and the second terminal T2 may be referred to as a "charging and discharging terminal" and used to both charge and discharge the battery device 200.

In some embodiments, the battery device 200 may include three or more batteries connected in series. For example, the battery device 200 may further include at least one additional battery between the first battery BAT1 and the connection node ND. Also, in some embodiments, the battery device 200 may include three or more batteries connected in series and in parallel. For example, the battery device 200 may further include at least one additional battery connected in parallel with the first battery BAT1 and/or at least one additional battery connected in parallel with the second battery BAT2.

In an embodiment, the first battery BAT1 may be a first battery cell, the second battery BAT2 may be a second battery cell, and the battery device 200 may be a multi-cell battery including multiple battery cells connected to each other in series. For example, the battery device 200 may be implemented as a battery pack. In an embodiment, the first battery BAT1 may be a first battery pack, the second battery BAT2 may be a second battery pack, and the battery device 200 may be implemented as a battery device including multiple battery packs connected to each other in series. In an embodiment, at least one of the first battery pack and the second battery pack may be a multi-cell battery including multiple battery cells. In an embodiment, at least one of the first battery pack and the second battery pack may be a single-cell battery including only one battery cell.

In addition, the electronic device 10 may further include a fuel gauge 110 and a sense resistor Rsen. The fuel gauge 110 may be implemented as a portion of an IC 100 (integrated circuit) or an IC chip. For example, the IC 100 may be an interface-power management IC (IF-PMIC). The IC 100 and the sense resistor Rsen may be mounted on a printed circuit board BD.

The sense resistor Rsen may be connected in series to the second battery BAT2, and specifically, between the third terminal T3 and a ground terminal GND. Accordingly, the electronic device 10 may measure a current I2a flowing in the second battery BAT2 through the sense resistor Rsen. In the present specification, the current I2a flowing in the second battery BAT2, which is measured through the sense resistor Rsen, will be referred to as a "measurement current I2a". In FIG. 1, the sense resistor Rsen is represented by one resistor element. However, sense resistors according to the present disclosure are not limited thereto and the sense resistor Rsen may be implemented by any element or combination of elements having a resistance component.

Since the electronic device 10 does not include a sense resistor connected to the first battery BAT1, a current flowing in the first battery BAT1 may not be measured. If the battery device 200 is a two-terminal battery that does not include the second terminal T2, a current flowing in the first battery BAT1 and a current flowing in the second battery BAT2 will be the same. Therefore, it is possible to measure a current flowing in the first battery BAT1 and the second battery BAT2 through one sense resistor Rsen. However, since the battery device 200 according to the present embodiment is a three-terminal battery including the second terminal T2, a current flowing in the first battery BAT1 and a current flowing in the second battery BAT2 will be different from each other.

The fuel gauge 110 may determine or estimate a state of charge (SOC) of the battery device 200. Since it is difficult to measure energy actually stored in the battery device 200, a charge state may be used as a parameter (e.g., a basis) for measuring energy available in the battery device 200. The SOC may be defined as a percentage (%), as a ratio of the present capacity (the present level of charge) to the maximum capacity (the maximum possible level of charge) of the battery device 200.

The fuel gauge 110 may be implemented by hardware and/or software that is capable of monitoring the SOC of the battery device 200. The fuel gauge 110 may implement processes as described herein. In an embodiment, the fuel gauge 110 may determine the SOC of the battery device 200 by monitoring the remaining amount (the present level of charge), the voltage, the current, and/or the temperature of the battery device 200 and thus may be a battery fuel gauge or a battery gauge even though implemented in the IC 100 rather than the battery device 200.

A first terminal voltage V1 of the first battery BAT1 may be the measurable voltage between the cathode or positive side and the anode or negative side of the first battery BAT1, that is, across the first battery BAT1. A second terminal voltage V2 of the second battery BAT2 may be the measurable voltage between the cathode or positive side and the anode or negative side of the second battery BAT2, that is, across the second battery BAT2. In the present embodiment, the fuel gauge 110 may determine the SOC of the battery device 200, based on the first terminal voltage V1 of the first battery BAT1, the second terminal voltage V2 of the second battery BAT2, and the measurement current I2a flowing in the second battery BAT2. As explained below, the fuel gauge 110 may estimate or calculate the current flowing in the first battery BAT1, based on the second terminal voltage V2 of the second battery BAT2 and the measurement current I2a flowing in the second battery BAT2.

The fuel gauge 110 may estimate or calculate the current flowing in the first battery BAT1, based on a battery model and based on the measurement current I2a flowing in the second battery BAT2. Specifically, the fuel gauge 110 may calculate a calculation current of the second battery BAT2 by using a battery parameter of the battery model and may determine whether to correct the battery parameter based on the difference between the calculation current and the measurement current I2a. For example, the fuel gauge 110 may correct the battery parameter based on battery parameters predetermined according to temperature, load, SOC, and the like. The battery model may be an electric circuit model, and the electric circuit model may be designed based on electrical characteristics experiment and data of a battery. In this case, the electric circuit model is obtained by modelling a battery by electrical characteristics such as resistance and impedance based on the dynamic characteristics and operation principle of the battery. For example, the battery model may be an electro-chemical model. In this case, the electro-chemical model is obtained by modelling a battery based on physical phenomena in an anode of the battery, in a cathode of the battery, and in an electrolyte of the battery. The battery model and a current calculation method using the battery model will be described in more detail with reference to FIG. 2 to FIG. 4.

Therefore, even if the electronic device 10 does not include a sense resistor for sensing a current flowing in the first battery BAT1, the fuel gauge 110 may calculate a first SOC of the first battery BAT1 by estimating or calculating the current flowing in the first battery BAT1 based on a battery model and based on the measurement current I2a flowing in the second battery BAT2. Also, the fuel gauge 110 may calculate a second SOC of the second battery BAT2 based on the measured current I2a flowing in the second battery BAT2 and may determine the SOC of the battery device 200 based on the first SOC and the second SOC.

Figure 11:
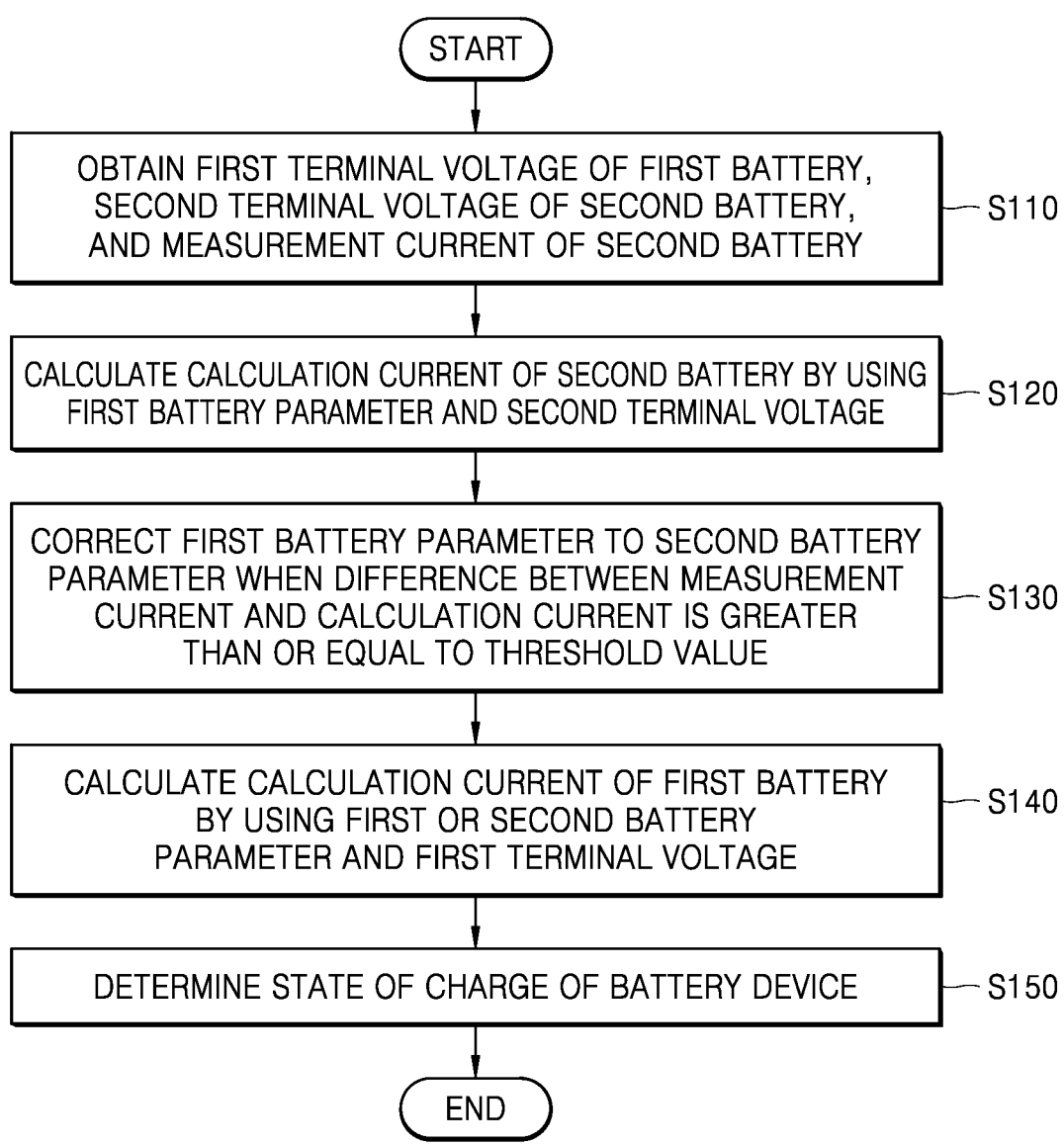
FIG. 11 is a flowchart illustrating a method of operating an electronic device for determining a state of charge (SOC) of a battery, according to an embodiment.
Figure 12:
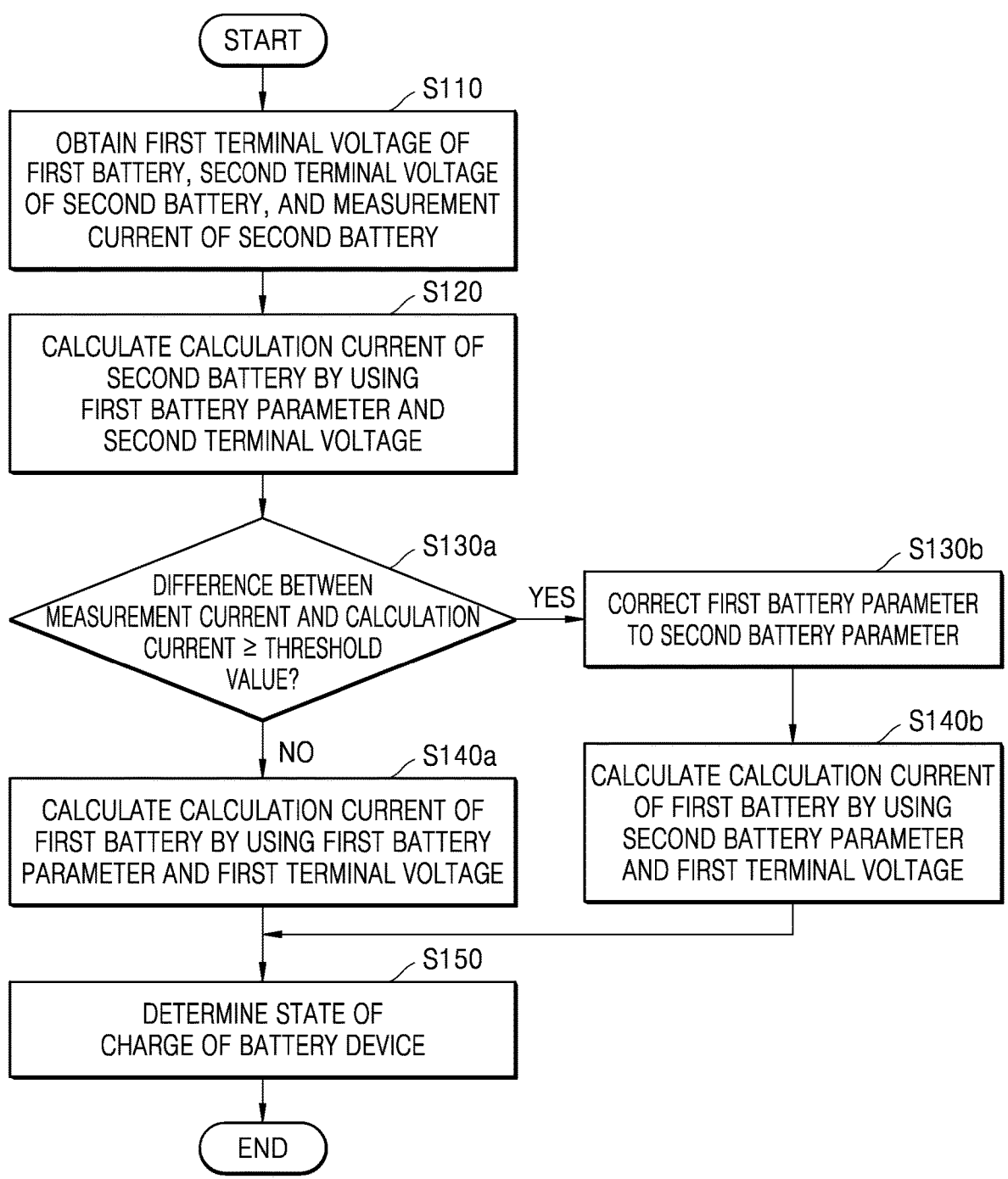
FIG. 12 is a flowchart illustrating in more detail a method of operating an electronic device for determining an SOC of a battery, according to an embodiment.
Figure 13:
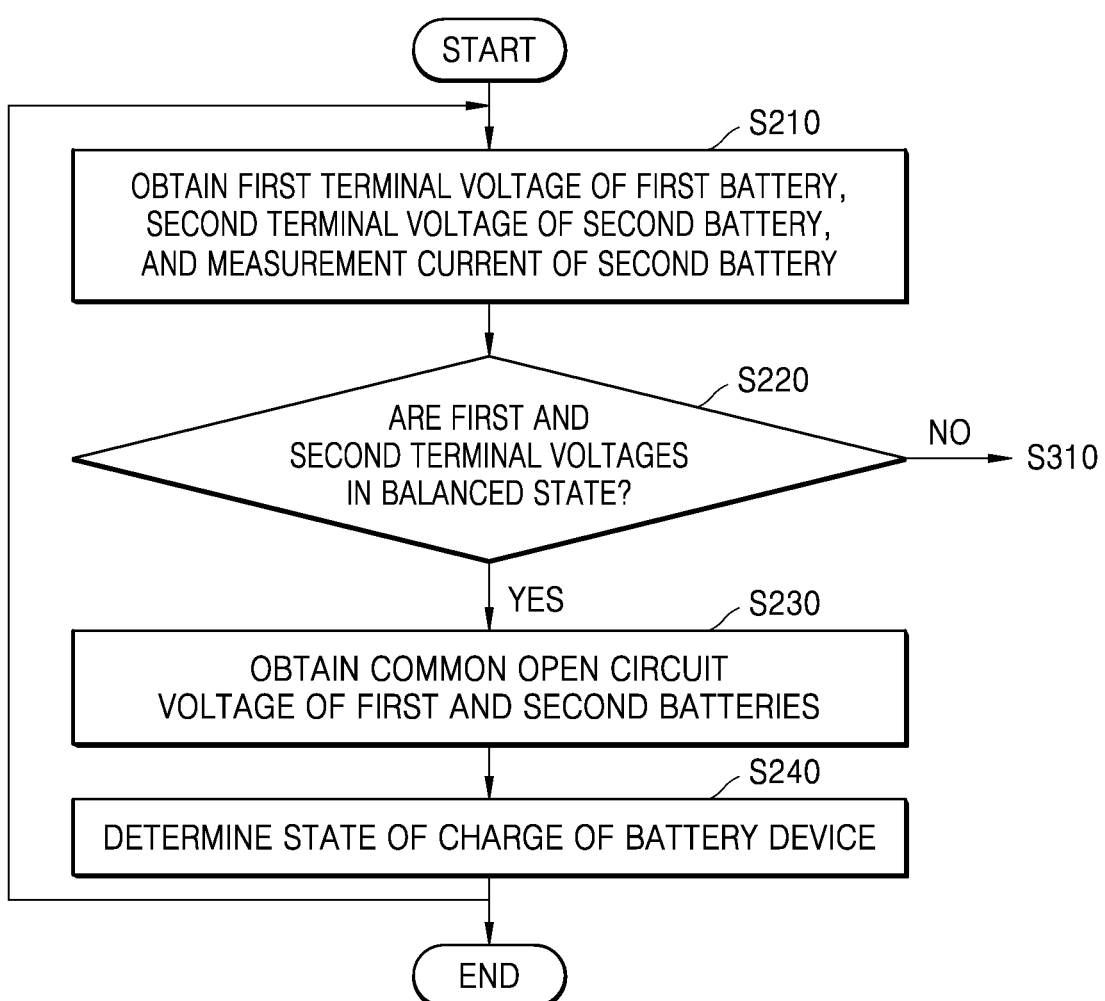
FIG. 13 is a flowchart illustrating a method of operating an electronic device for determining an SOC of a battery, according to an embodiment.

In some embodiments, the IC 100 may further include a processor (e.g., a microprocessor) or control logic such as one or more application-specific integrated circuits) and the processor or the control logic may control the fuel gauge 110. In some embodiments, the electronic device 10 may include a processor or control logic external to the IC 100 and the processor or control logic may control the fuel gauge 110. In the case of a processor, the processor may execute instructions by which a gauging method of the fuel gauge 110, e.g., a method of determining an SOC of a battery device, is implemented. Examples of such a method are illustrated in FIGS. 11, 12, 13, and/or 16.

Figure 2:
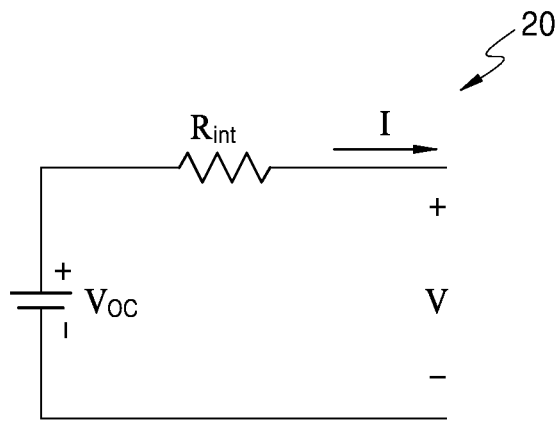
FIG. 2 illustrates an equivalent circuit for a battery model according to an embodiment.

FIG. 2 illustrates an equivalent circuit for a battery model 20 according to an embodiment.

Referring to FIG. 2, the battery model 20 may be a simple battery model having an internal resistance $R_{int}$. The internal resistance $R_{int}$ may be caused by internal circuit path resistance and contact resistance of a battery. In this case, the internal resistance $R_{int}$ may be a battery parameter of the battery model 20. When a current flowing in the battery model 20 is I and a battery voltage is V, an open circuit voltage $V_{OC}$ of the battery model 20 may be expressed as $V+I \cdot R_{int}$ (that is, $V_{OC}=V+I \cdot R_{int}$). Accordingly, when the battery model 20 is used, a current I may be calculated from the open circuit voltage $V_{OC}$ and the battery voltage V (that is, $I=(V_{OC}-V)/R_{int}$).

Referring to FIGS. 1 and 2, it may be assumed that battery models of the first battery BAT1 and the second battery BAT2 are the same as the battery model 20. The fuel gauge 110 may calculate a calculation current I2b of the second battery BAT2 by using the second terminal voltage V2 of the second battery BAT2 (the measurable voltage across the second battery BAT2) and the battery parameter, i.e., the internal resistance $R_{int}$ of the battery model 20 (that is, $I2b=(V_{OC}-V2)/R_{int}$). When the difference between the measurement current I2a and the calculation current I2b of the second battery BAT2 is less than a threshold value, the battery model 20 may be determined to be reliable. On the other hand, when the difference between the measurement current I2a and the calculation current I2b of the second battery BAT2 is equal to or greater than the threshold value, the battery model 20 may be determined to be unreliable.

When the difference between the measurement current I2a and the calculation current I2b of the second battery BAT2 is less than the threshold value, the fuel gauge 110 may calculate a calculation current I1 of the first battery BAT1 from the first terminal voltage V1 of the first battery BAT1 (the measurable voltage across the first battery BAT1) by using the battery model 20. Specifically, the fuel gauge 110 may calculate the calculation current I1 of the first battery BAT1 by using the internal resistance $R_{int}$, as shown in Equation 1 below.

$$I1=(V_{OC}-V1)/R_{int} \qquad \text{[Equation 1]}$$

On the other hand, when the difference between the measurement current I2a and the calculation current I2b of the second battery BAT2 is greater than or equal to the threshold value, the fuel gauge 110 may correct the battery parameter of the battery model 20 and calculate the calculation current I1 of the first battery BAT1 from the first terminal voltage V1 of the first battery BAT1 by using the corrected battery parameter. Specifically, the fuel gauge 110 may calculate the calculation current I1 of the first battery BAT1 by using a corrected internal resistance $R_{int}'$, as shown in Equation 2 below.

$$I1 = (V_{OC} - V1)/R_{int}' \quad \text{[Equation 2]}$$

Figure 3:
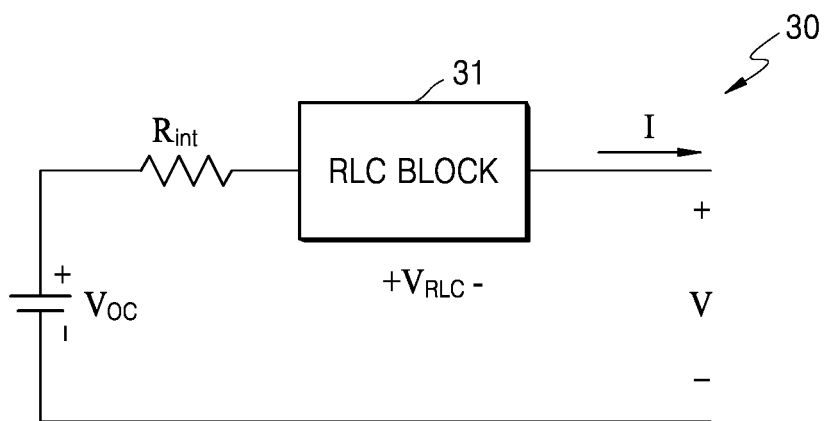
FIG. 3 illustrates another equivalent circuit for another battery model according to an embodiment.

FIG. 3 illustrates another equivalent circuit for another battery model 30 according to an embodiment.

Referring to FIG. 3, the battery model 30 may be a general battery model including an internal resistance $R_{int}$ and an RLC block 31. The RLC block 31 may include at least one of at least one resistor, at least one inductance, and at least one capacitance. An internal configuration of the RLC block 31 may be variously changed according to the battery model 30. Also, in some embodiments, the battery model 30 may include multiple RLC blocks including the RLC block 31.

In this case, the internal resistance $R_{int}$ and the impedance (e.g., resistance, inductance, and capacitance) of the RLC block 31 may be battery parameters of the battery model 30. When a current flowing in the battery model 30 is I, a battery voltage is V, and a voltage across the RLC block 31 is $V_{RLC}$, an open circuit voltage $V_{OC}$ of the battery model 30 may be expressed as $V+V_{RLC}+I \cdot R_{int}$ (that is, $V_{OC}=V+V_{RLC}+I \cdot R_{int}$). Accordingly, when the battery model 30 is used, the current I may be calculated from the open circuit voltage $V_{OC}$, the battery voltage V, and the voltage $V_{RLC}$ across the RLC block 31 (that is, $I=(VOC-V-V_{RLC})/R_{int}$).

Referring to FIGS. 1 and 3, it may be assumed that battery models of the first battery BAT1 and the second battery BAT2 are the same as the battery model 30. The fuel gauge 110 may calculate a calculation current I2b of the second battery BAT2 by using the second terminal voltage V2 of the second battery BAT2 (the measurable voltage across the second battery BAT2) and the battery parameter(s) (i.e., the internal resistance $R_{int}$ and the impedance (e.g., resistance, inductance, and capacitance) of the RLC block 31) of the battery model 20 (that is, $I2b=(V_{OC}-V2-V_{RLC})/R_{int}$). When the difference between the measurement current I2a and the calculation current I2b of the second battery BAT2 is less than a threshold value, the fuel gauge 110 may calculate a calculation current I1 of the first battery BAT1 from the first terminal voltage V1 of the first battery BAT1 (the measurable voltage across the first battery BAT1) by using the battery model 30, as shown in Equation 3 below.

$$I1 = (V_{OC} - V1 - V_{RLC})/R_{int} \quad \text{[Equation 3]}$$

When the difference between the measurement current I2a and the calculation current I2b of the second battery BAT2 is greater than or equal to the threshold value, the fuel gauge 110 may correct the battery parameter(s) of the battery model 20 and calculate the calculation current I1 of the first battery BAT1 from the first terminal voltage V1 of the first battery BAT1 by using the corrected battery parameter(s). Specifically, the fuel gauge 110 may calculate the calculation current I1 of the first battery BAT1 by using a voltage $V_{RLC}'$ derived from a corrected impedance of the RLC block 31 and a corrected internal resistance $R_{int}'$, as shown in Equation 4 below.

$$I1 = (V_{OC} - V1 - V_{RLC}')/R_{int}' \quad \text{[Equation 4]}$$

Figure 4:
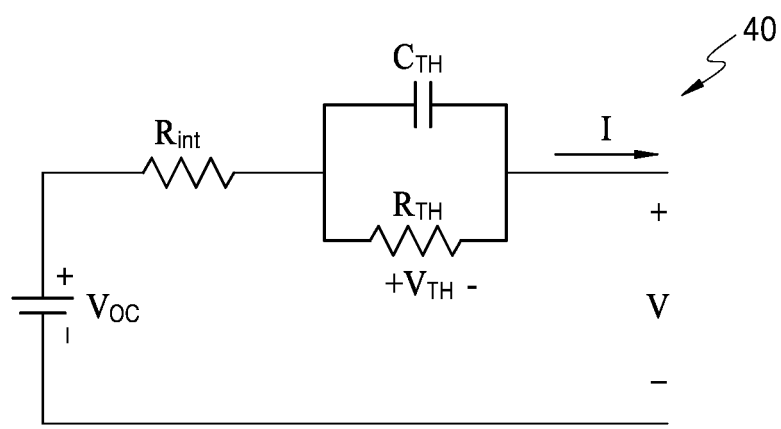
FIG. 4 illustrates another equivalent circuit for another battery model according to an embodiment.

FIG. 4 illustrates another equivalent circuit for another battery model 40 according to an embodiment.

Referring to FIG. 4, the battery model 40 may be a Thevenin battery model having an internal resistance $R_{int}$, a Thevenin resistance $R_{TH}$, and a Thevenin capacitance $C_{TH}$. The battery model 40 may correspond to an example of the battery model 30 of FIG. 3, and the Thevenin resistance $R_{TH}$ and the Thevenin capacitance $C_{TH}$ connected in parallel may be an example of the RLC block 31. When a current flowing in the battery model 40 is I, a battery voltage is V, and a voltage across the Thevenin resistance $R_{TH}$ is $V_{TH}$, an open circuit voltage $V_{OC}$ of the battery model 40 may be expressed as $V+V_{TH}+I \cdot R_{int}$ (that is, $V_{OC}=V+V_{TH}+I \cdot R_{int}$). Accordingly, when the battery model 40 is used, a current I may be calculated from the open circuit voltage $V_{OC}$, the battery voltage V, and the voltage $V_{TH}$ across the Thevenin resistance $R_{TH}$ (that is, $I=(V_{OC}-V-V_{TH})/R_{int}$).

Referring to FIGS. 1 and 4, it may be assumed that battery models of the first battery BAT1 and the second battery BAT2 are the same as the battery model 40. The fuel gauge 110 may calculate a calculation current I2b of the second battery BAT2 by using the second terminal voltage V2 of the second battery BAT2 (the measurable voltage across the second battery BAT2) and the battery parameter(s) (i.e., the internal resistance $R_{int}$, the Thevenin resistance $R_{TH}$, and the Thevenin capacitance $C_{TH}$) of the battery model 40 (that is, $I2b=(V_{OC}-V2-V_{TH})/R_{int}$). When the difference between the measurement current I2a and the calculation current I2b of the second battery BAT2 is less than a threshold value, the battery model 40 may be determined to be reliable. In this case, the fuel gauge 110 may calculate a calculation current I1 of the first battery BAT1 from the first terminal voltage V1 of the first battery BAT1 (the measurable voltage across the first battery BAT1) by using the battery model 40, as shown in Equation 5 below.

$$I1 = (V_{OC} - V1 - V_{TH})/R_{int} \quad \text{[Equation 5]}$$

On the other hand, when the difference between the measurement current I2a and the calculation current I2b of the second battery BAT2 is greater than or equal to the threshold value, the fuel gauge 110 may correct the battery parameter(s) of the battery model 40 and calculate the calculation current I1 of the first battery BAT1 from the first terminal voltage V1 of the first battery BAT1 by using the corrected battery parameter(s). Specifically, the fuel gauge 110 may calculate the calculation current I1 of the first battery BAT1 by using a voltage $V_{TH}'$ derived from a corrected Thevenin resistance $R_{TH}'$ and a corrected Thevenin capacitance $C_{TH}'$, and a corrected internal resistance $R_{int}'$, as shown in Equation 6 below.

$$I1 = (V_{OC} - V1 - V_{TH}')/R_{int}' \quad \text{[Equation 6]}$$

Figure 5:
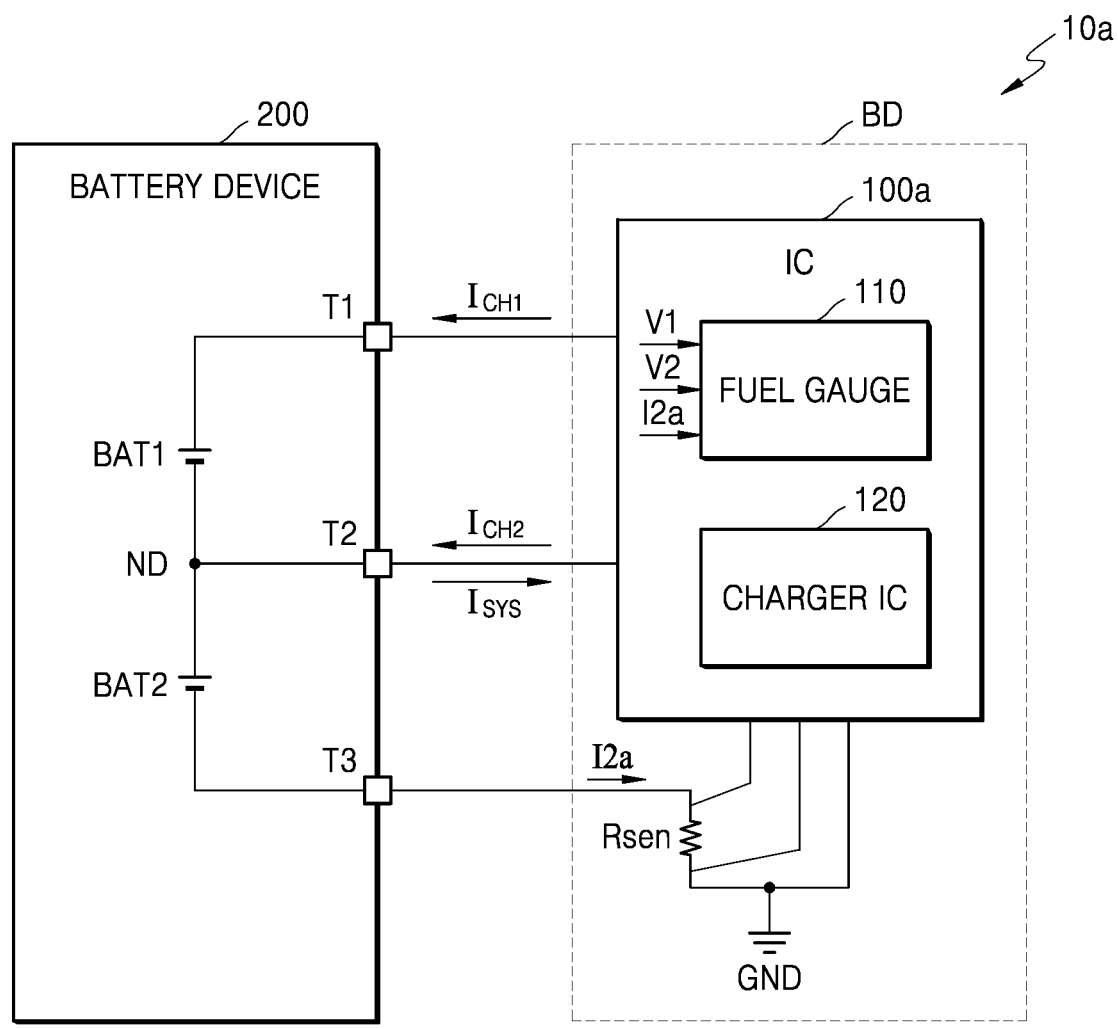
FIG. 5 is a block diagram illustrating an electronic device according to an embodiment.

FIG. 5 is a block diagram illustrating an electronic device 10a according to an embodiment.

Referring to FIG. 5, the electronic device 10a corresponds to an implementation example of the electronic device 10 of FIG. 1 and may further include a charger IC 120 as compared to the electronic device 10 of FIG. 1. In an embodiment, a fuel gauge 110 and the charger IC 120 may be implemented as a portion of an IC 100a or an IC chip and may be mounted on a printed circuit board (PCB) BD. However, the configurations of fuel gauges and charger ICs according to the present disclosure are not limited thereto, and the fuel gauge 110 and the charger IC 120 may be implemented as different integrated circuits or integrated circuit chips.

The charger IC 120 may provide a first charging current $I_{CH1}$ to a first terminal T1 of a battery device 200 in a first charge mode and provide a second charging current $I_{CH2}$ to a second terminal T2 of the battery device 200 in a second charge mode. As explained previously, the first terminal T1 may be connected to a high voltage node of the first battery BAT1, and the second terminal T2 may be connected to a connection node ND between the first battery BAT1 and the second battery BAT2. Additionally, the first charging current $I_{CH1}$ may be different in magnitude from the second charging current $I_{CH2}$. Hereinafter, the structure and operation of the charger IC 120 will be described in detail with reference to FIGS. 6 to 9.

In some embodiments, the IC 100a may further include a control logic. Control logic may be implemented as processor (e.g., microprocessor) that executes software instructions, and/or as an application-specific integrated circuit (ASIC). The control logic may control the charger IC 120 according to the first charge mode and the second charge mode or a discharge mode. In addition, the control logic may control the fuel gauge 110. In some embodiments, the IC 100a may further include a wireless power receiver, and the wireless power receiver may be implemented as a unit for both wireless charging and magnetic secure transmission (MST).

Figure 6:
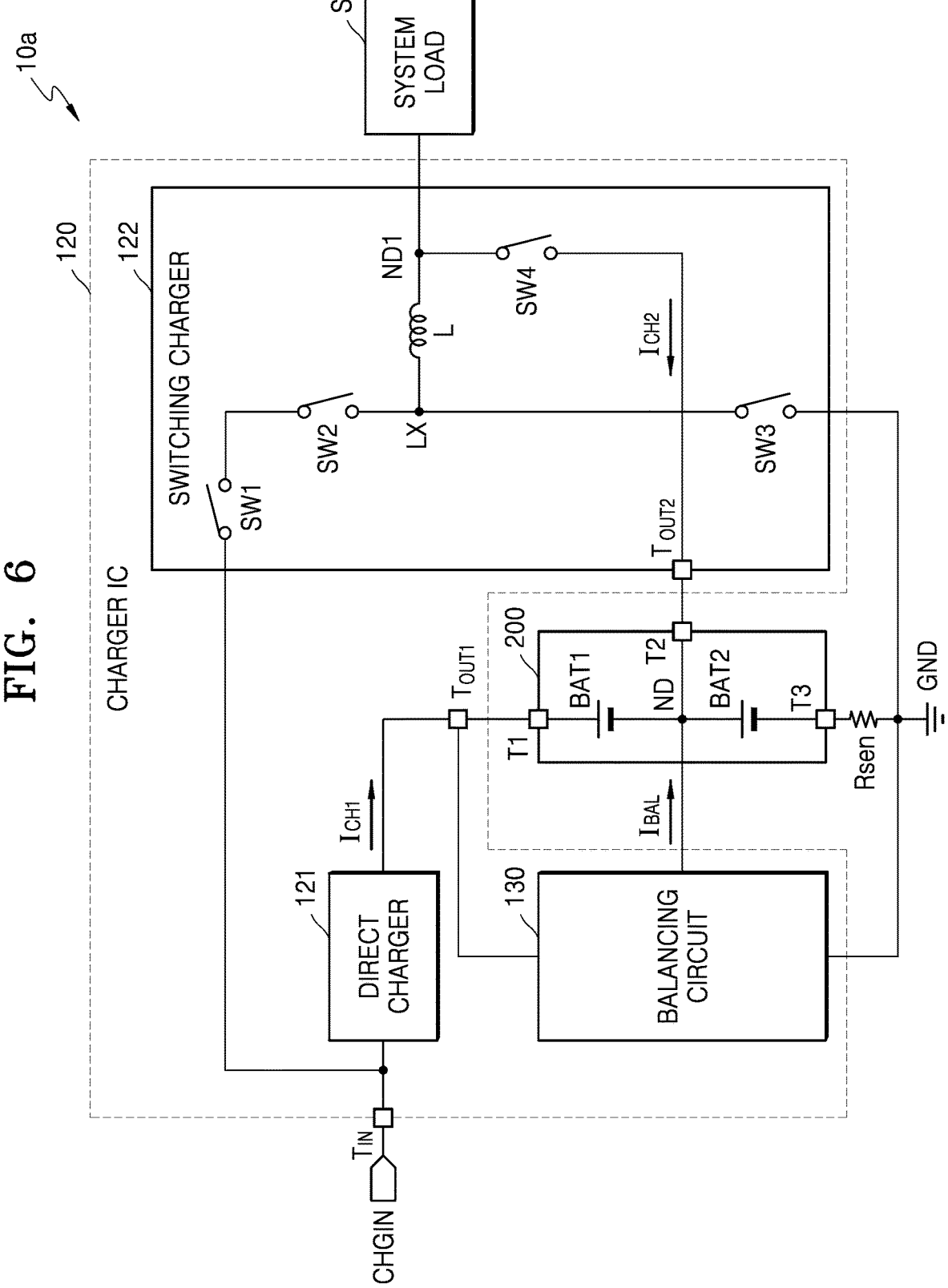
FIG. 6 illustrates a charger integrated circuit (IC) of FIG. 5 in more detail, according to an embodiment.

FIG. 6 illustrates the charger IC 120 of FIG. 5 in more detail, according to an embodiment.

Referring to FIG. 6, the electronic device 10a may include a charger IC 120, a battery device 200, and a system load SL. For example, the system load SL may be chips or modules included in the electronic device 10a, e.g., a modem, an application processor, a memory, and a display. For example, the system load SL may be an operation block, a functional block, or an intellectual property (IP) block included in the electronic device 10a. Blocks such as an operation block, a functional block or an IP block may be implemented as or by circuits and other elements which carry out a described operation, function or operations or functions. These blocks are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block may be physically separated into two or more interacting and discrete blocks. Likewise, the blocks may be physically combined into more complex blocks. Additionally, the acronym "IP" represents the term "intellectual property" and the term "IP block" references unique circuits and components of circuits that may each be separately subject to intellectual property protection. Examples of an operation block, a functional block or an IP block includes a multimedia block in an application processor or a memory controller. The system load SL may also be referred to as a consumption block or load.

The charger IC 120 may include a first charger 121, a second charger 122, and a balancing circuit 130. The charger IC 120 may charge the battery device 200. In an embodiment, the first charger 121, the second charger 122, and the balancing circuit 130 may be implemented as a single integrated circuit. However, the configurations of the first chargers, second chargers and balancing circuits according to the present disclosure are not limited thereto, and in some embodiments, at least one of the first charger 121, the second charger 122, and the balancing circuit 130 may be implemented as an integrated circuit separate from the others. For example, the first charger 121 and the second charger 122 may be implemented as a first IC and the balancing circuit 130 may be implemented as a second IC.

The charger IC 120 may further include an input voltage terminal $T_{IN}$, a first output terminal $T_{OUT1}$, and a second output terminal $T_{OUT2}$. The input voltage terminal $T_{IN}$ may be configured to receive an input voltage CHGIN. In an embodiment, the input voltage terminal $T_{IN}$ may be electrically connected to an output terminal of a travel adapter (TA). The TA may convert a household power alternating current (AC) of 110 Volts to 220 Volts or a power supplied from another power supply unit (e.g., a computer) to a DC power required for battery charging and supply the DC power to the electronic device 10a. In an embodiment, the input voltage terminal $T_{IN}$ may be electrically connected to an output terminal of an auxiliary battery. The charger IC 120 may charge the battery device 200 by using a DC power received from the TA or the auxiliary battery.

The first charger 121 may be connected between the input voltage terminal $T_{IN}$ and the first output terminal $T_{OUT1}$, and the first output terminal $T_{OUT1}$ may be electrically connected to the first terminal T1 of the battery device 200. The second charger 122 may be connected between the input voltage terminal $T_{IN}$ and the second output terminal $T_{OUT2}$, and the second output terminal $T_{OUT2}$ may be electrically connected to the second terminal T2 of the battery device 200. In an embodiment, when the input voltage CHGIN is received, the first charger 121 and the second charger 122 may selectively operate one at a time. However, the operations of the first chargers and the second chargers according to the present disclosure are not limited thereto, and in some embodiments, the first charger 121 and the second charger 122 may simultaneously operate when the input voltage CHGIN is received.

The first charger 121 may receive the input voltage CHGIN from the input voltage terminal $T_{IN}$ and generate a first charging current $I_{CH1}$ by using the received input voltage CHGIN. The first charger 121 may provide the first charging current $I_{CH1}$ to the first terminal T1 of the battery device 200 through the first output terminal $T_{OUT1}$. In an embodiment, the first charger 121 may be activated in the first charge mode. For example, the first charge mode may be a fast charge mode.

In an embodiment, the first charger 121 may be a direct charger. For example, the first charger 121 may include at least one transistor. The first charger 121 may directly charge the battery device 200 by a direct charging method in which the input voltage CHGIN is directly connected to the battery device 200. The charging efficiency of the direct charging method may be higher than that of a switching charging method using the second charger 122. The higher charging efficiency of the direct charging method may be correlated with or reflected in faster charging times and/or faster currents than in the switching charging method.

The second charger 122 may receive the input voltage CHGIN from the input voltage terminal $T_{IN}$ and generate a second charging current $I_{CH2}$ by using the received input voltage CHGIN. The second charger 122 may provide the second charging current $I_{CH2}$ to the second terminal T2 of the battery device 200 through the second output terminal $T_{OUT2}$. In an embodiment, the second charger 122 may be activated in the second charge mode. For example, the second charge mode may be a normal charge mode, which has a lower efficiency than the fast charge mode.

In an embodiment, the second charger 122 may be a switching charger. The second charger 122 may include a first switch SW1, a second switch SW2, a third switch SW3, a fourth switch SW4 and an inductor L. For example, the first switch SW1, the second switch SW2, the third switch SW3 and the fourth switch SW4 may be implemented as power switches. For example, each of the first switch SW1, the second switch SW2, the third switch SW3 and the fourth switch SW4 may include a transistor and a diode. The first switch SW1, the second switch SW2, the third switch SW3 and the fourth switch SW4 may be driven by a control logic. The control logic may be implemented in the charger IC 120 of FIG. 5 and/or of FIG. 6, elsewhere in the IC 100a of FIG. 5, a PMIC 300 of FIG. 21, or an AP 400 (application processor) of FIG. 21. However, the structure of the second charger 122 is not limited thereto, and according to embodiments, the number of switches or inductors included in the second charger 122 and location and configuration of control logic may be variously changed. Also, the second charger 122 may be implemented as a linear charger.

The first switch SW1 and the second switch SW2 may be connected in series between the input voltage terminal $T_{IN}$ and a switching node LX and may provide the input voltage CHGIN to the switching node LX. For example, the first switch SW1 may be turned on in the second charge mode. Accordingly, the first switch SW1 may be a charging switch that is used to provide a charging current to the inductor L. The third switch SW3 may be connected between the switching node LX and a ground terminal GND and may provide a ground voltage to the switching node LX. The inductor L may be connected between the switching node LX and a first output node ND1. The second and third switches SW2 and SW3 may be turned on alternately with each other.

The fourth switch SW4 may be connected between the first output node ND1 and the second output terminal $T_{OUT2}$. The fourth switch SW4 may be supplied with a voltage from the inductor L through the first output node ND1 and may supply the voltage to the battery device 200 through the second output terminal $T_{OUT2}$. In an embodiment, when the fourth switch SW4 is turned on, the second charge current $I_{CH2}$ may be provided to the battery device 200 through the second output terminal $T_{OUT2}$. Also, in an embodiment, when the fourth switch SW4 is turned on, a system current (e.g., a current $I_{SYS}$ in FIG. 5) may be provided from the battery device 200 to the system load SL and the system current (e.g., a current $I_{SYS}$ in FIG. 5) may flow in a direction opposite to the direction of the second charging current $I_{CH2}$. Accordingly, the fourth switch SW4 may be a battery switch that is used to provide the second charge current $I_{CH2}$ from the inductor L and/or the system current $I_{SYS}$ from the battery device 200.

The balancing circuit 130 may be configured to balance the voltage of the first battery BAT1 and the voltage of the second battery BAT2. The balancing circuit 130 may charge an undercharged battery of the first battery BAT1 and the second battery BAT2 by using the energy of an overcharged battery of the first battery BAT1 and the second battery BAT2, and thus, the voltage of the first battery BAT1 and the voltage of the second battery BAT2 may be balanced. Specifically, the balancing circuit 130 may provide a balancing current $I_{BAL}$ to the battery device 200 to balance the voltage of the first battery BAT1 and the voltage of the second battery BAT2.

In an embodiment, the balancing circuit 130 may be implemented with at least one capacitor. In an embodiment, the balancing circuit 130 may be implemented with at least one inductor. In some embodiments, the balancing circuit 130 may be located outside the charger IC 120. In one embodiment, the balancing circuit 130 and the battery device 200 may be integrated. For example, the balancing circuit 130 may be implemented as a portion of the battery device 200. In other words, the balancing circuit 130 may be implemented as an internal component of the battery device 200.

In some embodiments, the charger IC 120 may further include a block (e.g., a circuit) that supports at least one of various functions, such as an under-voltage lockout (UVLO) function, an over-current protection (OCP) function, an over-voltage protection (OVP) function, a soft-start function to reduce inrush current, a foldback current limit function, a hiccup mode function for short circuit protection, and an over-temperature protection (OTP) function, to properly operate under power saving conditions.

Figure 7:
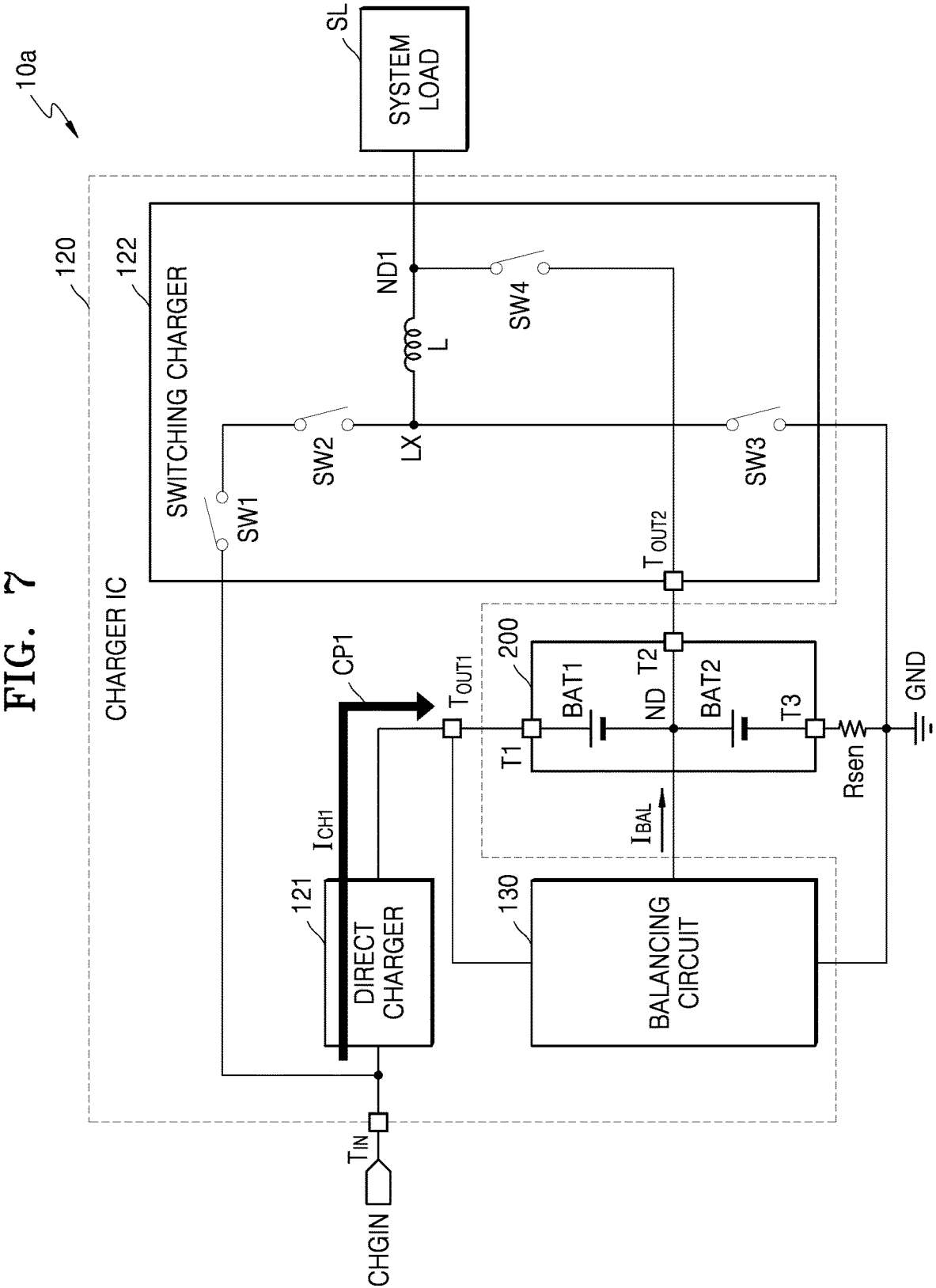
FIG. 7 illustrates a first charge mode performed by a first charger, according to an embodiment.

FIG. 7 illustrates a first charge mode performed by the first charger 121, according to an embodiment.

Referring to FIG. 7, in the first charge mode, the second charger 122 may be deactivated and the first charger 121 may be activated. In the first charge mode, the first switch SW1, the second switch SW2, the third switch SW3 and the fourth switch SW4 may be turned off. Accordingly, a first charge path CP1 may be generated. The first charging current $I_{CH1}$ may be supplied to the first terminal T1 of the battery device 200 via the first charge path CP1. The first battery BAT1 and the second battery BAT2 may be charged using the first charging current $I_{CH1}$ and the balancing circuit 130 may balance the voltages of the first battery BAT and the second battery BAT2 by using the balancing current $I_{BAL}$.

However, the operations of the first chargers and the second chargers are not limited thereto, and in some embodiments, both the first charger 121 and the second charger 122 may be activated in the first charge mode. In this case, the time required for charging the battery device 200 may be further reduced. In some embodiments, in the first charge mode, the first charger 121 may charge the battery device 200 and the second charger 122 may supply a system voltage (e.g., a system voltage $V_{SYS}$ of FIG. 9) to the system load SL. For example, by turning on the first switch SW1, turning on or off the second and third switches SW2 and SW3, and turning off the fourth switch SW4, the second charger 122 may supply the system voltage $V_{SYS}$ to the system load SL in a buck mode. In some embodiments, the fourth switch SW4 may be turned on in the first charge mode. Accordingly, the system voltage $V_{SYS}$ may be supplied from the battery device 200 to the system load SL.

Figure 8:
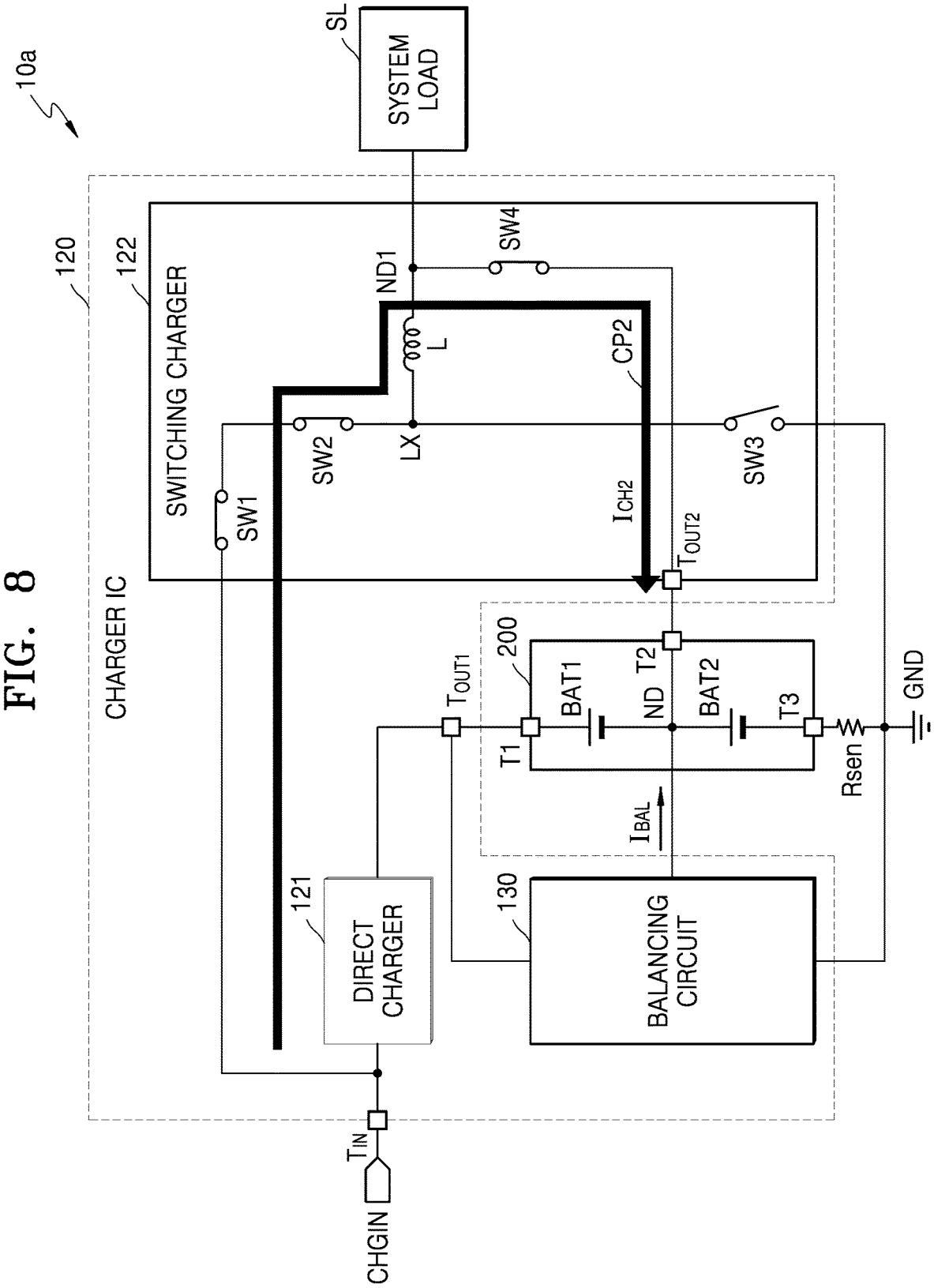
FIG. 8 illustrates a second charge mode performed by a second charger, according to an embodiment.

FIG. 8 illustrates a second charge mode performed by the second charger 122, according to an embodiment.

Referring to FIG. 8, in the second charge mode, the second charger 122 may be activated and the first charger 121 may be deactivated. In the second charge mode, the first switch SW1, the second switch SW2, the third switch SW3 and the fourth switch SW4 may be selectively turned on. Accordingly, a second charge path CP2 may be generated. The second charging current $I_{CH2}$ may be supplied to the second terminal T2 of the battery device 200 via the second charge path CP2. The second battery BAT2 may be charged using the second charging current $I_{CH2}$ and the balancing circuit 130 may balance the voltages of the first battery BAT1 and the second battery BAT2 by using the balancing current $I_{BAL}$.

Figure 9:
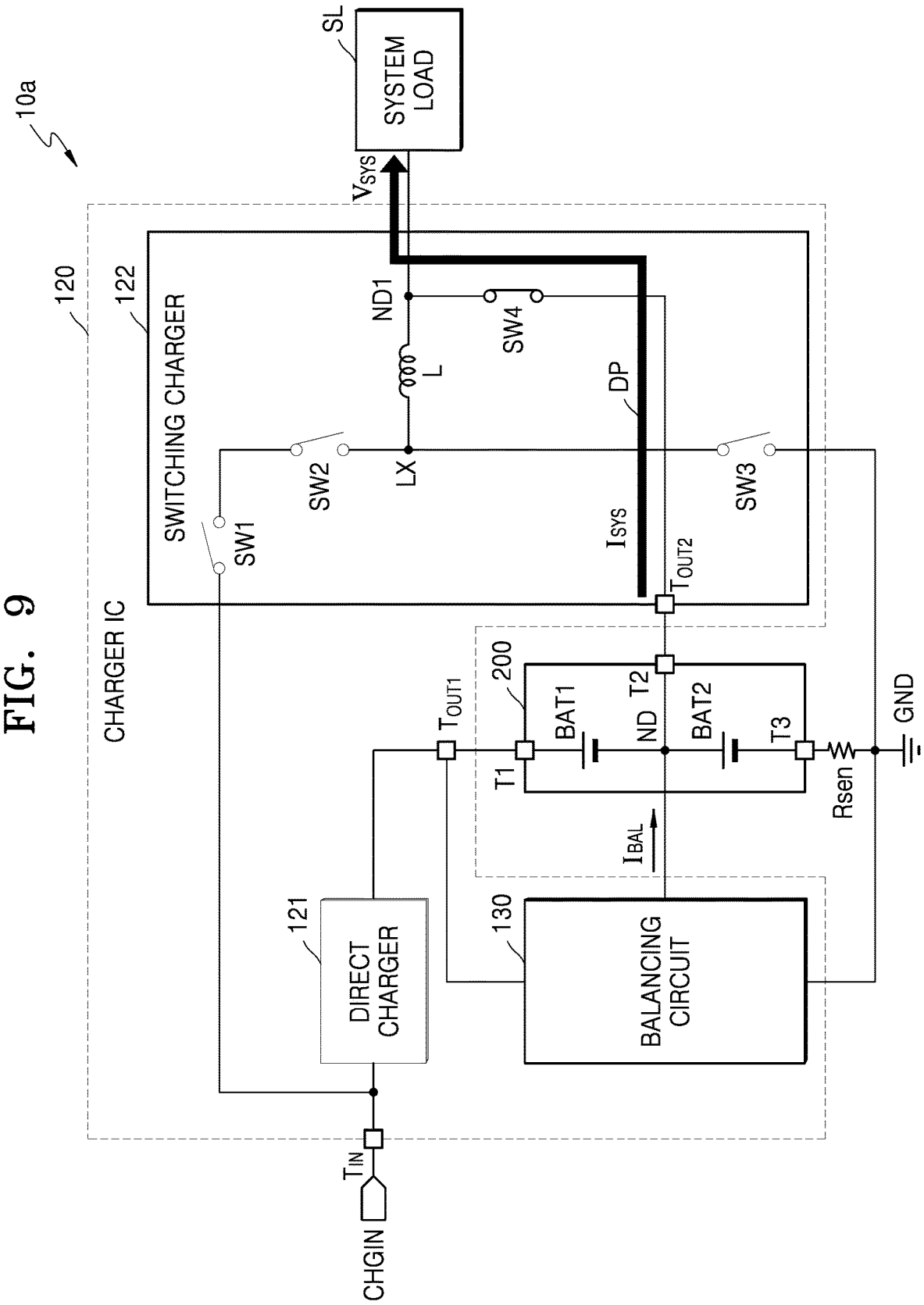
FIG. 9 illustrates a discharge mode of an electronic device according to an embodiment.

FIG. 9 illustrates a discharge mode of the electronic device 10a according to an embodiment.

Referring to FIG. 9, both the first charger 121 and the second charger 122 may be deactivated in the discharge mode or a battery only mode. In the discharge mode, the fourth switch SW4 may be turned on. Accordingly, a discharge path DP may be generated. For example, the discharge mode may be, but is not limited to, the case where a power source is not connected to the electronic device 10a, such as when the input voltage CHGIN is not applied to the electronic device 10a. In the discharge mode, an effective battery capacity may correspond to the sum of the battery capacity of the first battery BAT1 and the battery capacity of the second battery BAT2.

The system current $I_{SYS}$ may be supplied to the system load SL via the discharge path DP. Specifically, the system current $I_{SYS}$ may be supplied from the voltage of the second battery BAT2, and the balancing circuit 130 may charge the second battery BAT2 from the first battery BAT1. In this case, since the system voltage $V_{SYS}$ is transferred to the system load SL via the fourth switch SW4, the system voltage $V_{SYS}$ may be stably transferred to the system load SL even if the voltage of the second battery BAT2 fluctuates. When the battery voltage of the battery device 200 is equal to or less than a certain voltage, the fourth switch SW4 may be turned off and the discharge path DP may be disconnected.

However, the operations of the electronic devices in the discharge mode according to the present disclosure are not limited thereto. In some embodiments, in the discharge mode, only the fourth switch SW4 may be turned on and the balancing circuit 130 may also be deactivated. Specifically, only the fourth switch SW4 included in the second charger 122 may be turned on and both the first charger 121 and the balancing circuit 130 may be deactivated. Accordingly, the system current $I_{SYS}$ may be supplied only from the second battery BAT2 of the first battery BAT1 and the second battery BAT2.

Figure 10:
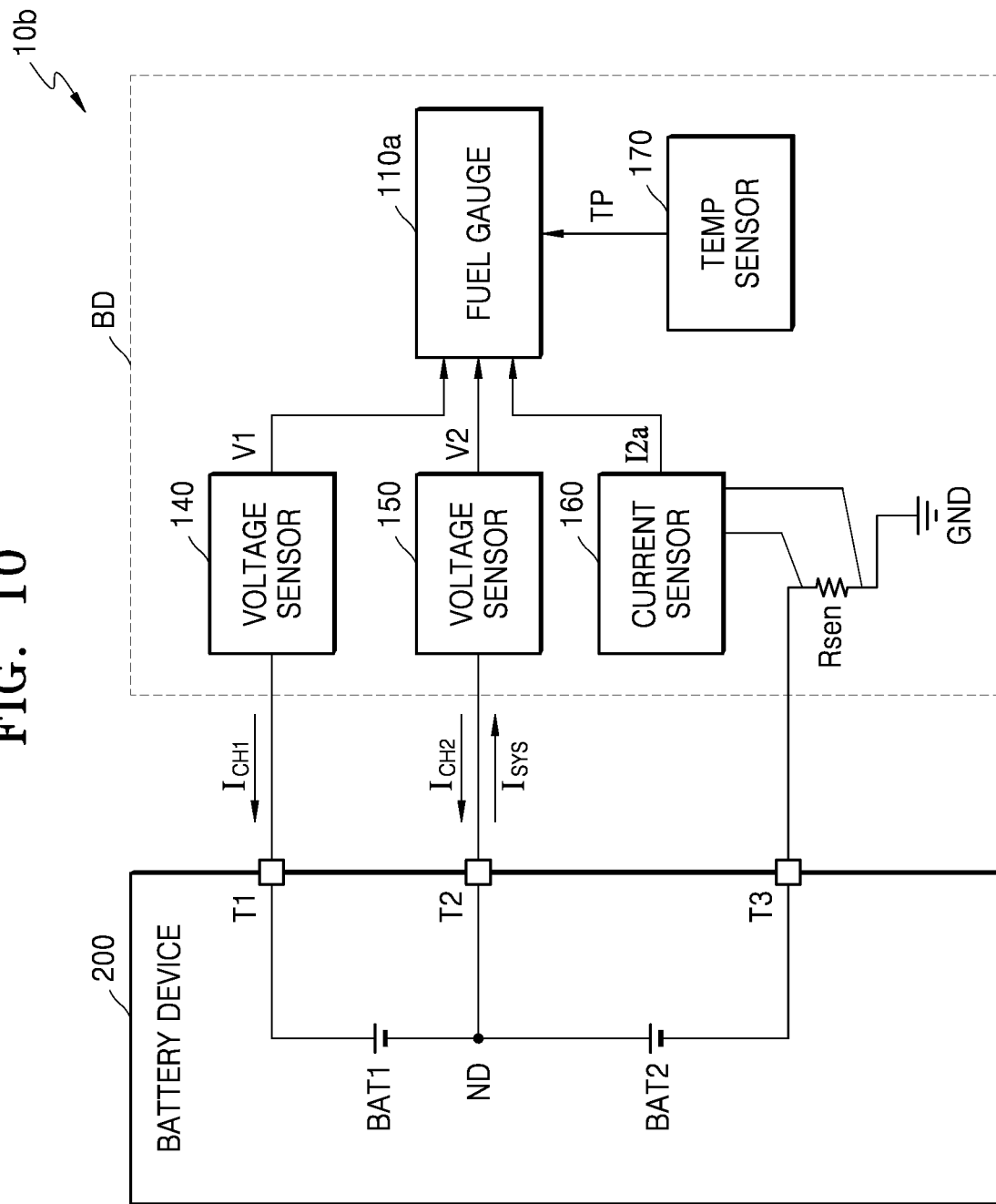
FIG. 10 is a block diagram illustrating an electronic device according to another embodiment.

FIG. 10 is a block diagram illustrating an electronic device 10b according to another embodiment.

Referring to FIG. 10, the electronic device 10b corresponds to a variation of the electronic device 10 of FIG. 1 and may further include voltage sensor 140 and voltage sensor 150, a current sensor 160, and a temperature sensor 170 as compared to the electronic device 10 of FIG. 1. A fuel gauge 110a, a sense resistor Rsen, the voltage sensor 140 and the voltage sensor 150, the current sensor 160, and the temperature sensor 170 may be mounted on a printed circuit board (PCB) BD. However, the configurations of temperature sensors according to the present disclosure are not limited thereto, and the temperature sensor 170 may be included in a battery device 200.

The voltage sensor 140 may sense a first terminal voltage V1 of a first battery BAT1 (the measurable voltage across the first battery BAT1) and the voltage sensor 150 may sense a second terminal voltage V2 of a second battery BAT2 (the measurable voltage across the second battery BAT2). The current sensor 160 may sense a measurement current I2a flowing through the sense resistor Rsen. In an embodiment, each of the voltage sensor 140, the voltage sensor 150, and the current sensor 160 may include an analog-to-digital converter (ADC) and may convert an analog sensing result to a digital sensing result and provide the digital sensing result to the fuel gauge 110a. The temperature sensor 170 may sense the temperature of the electronic device 10b and may provide sensed temperature data TD to the fuel gauge 110a.

FIG. 11 is a flowchart illustrating a method of determining an SOC of a battery, according to an embodiment. Referring to FIG. 11, the method of determining the SOC of the battery may include, for example, operations performed in time series in the fuel gauge 110 of the electronic device 10 of FIG. 1. The description given above with reference to FIGS. 1 to 10 may be applied to the present embodiment, and a repeated description will be omitted.

In operation S110, the first terminal voltage V1 of the first battery BAT1, the second terminal voltage V2 of the second battery BAT2, and the measurement current I2a of the second battery BAT2 are obtained. The measurement current I2a may correspond to a current flowing through the sense resistor Rsen connected in series to the second battery BAT2. In an embodiment, the fuel gauge 110 may be implemented to include a hardware configuration capable of sensing the first terminal voltage V1 (the measurable voltage across the first battery BAT1), the second terminal voltage V2 of the second battery BAT2 (the measurable voltage across the second battery BAT2), and the measurement current I2a. In an embodiment, the fuel gauge 110 may receive the first terminal voltage V1, the second terminal voltage V2, and the measurement current I2a from the outside. For example, the fuel gauge 110 may receive the first terminal voltage V1, the second terminal voltage V2, and the measurement current I2a from the voltage sensor 140, the voltage sensor 150, and the current sensor 160 in FIG. 10, respectively.

In operation S120, the calculation current I2b of the second battery BAT2 is calculated using one or more first battery parameter(s) and the second terminal voltage V2 of the second battery BAT2. For example, the first battery parameter(s) may include at least one of a resistance, a capacitance, and an inductance included in a predetermined equivalent circuit model of the second battery BAT2. The fuel gauge 110 may calculate the calculation current I2b of the second battery BAT2 based on the first battery parameter(s), an open circuit voltage of the second battery BAT2, and the second terminal voltage V2 of the second battery BAT2.

In operation S130, when the difference between the measurement current I2a and the calculation current I2b is greater than or equal to a threshold value, the first battery parameter(s) is/are corrected to second battery parameter(s). In an embodiment, the first battery parameter(s) may be corrected to the second battery parameter(s) based on the measurement current I2a of the second battery BAT2. In an embodiment, the first battery parameter(s) and the second battery parameter(s) may be determined in advance, and the battery parameter(s) may be determined as the first battery parameter(s) or the second battery parameter(s) based on the measurement current I2a or the open circuit voltage of the second battery BAT2.

In operation S140, the calculation current I1 of the first battery BAT1 is calculated using the first terminal voltage V1 and the first battery parameter(s) or the second battery parameter(s). The fuel gauge 110 may calculate the calculation current I1 of the first battery BAT1 based on the first battery parameter(s) or the second battery parameter(s), the open circuit voltage of the first battery BAT1, and the first terminal voltage V1 of the first battery BAT1. For example, the fuel gauge 110 may calculate the calculation current I1 of the first battery BAT1 according to Equations 1 to 6 described above, based on a battery model.

In operation S150, an SOC of the battery device 200 is determined. The fuel gauge 110 may determine a first SOC of the first battery BAT1 based on the first terminal voltage V1 and the calculation current I1 of the first battery BAT1. Also, the fuel gauge 110 may determine a second SOC of the second battery BAT2 based on the second terminal voltage V2 of the second battery BAT2, and the measurement current I2a or the calculation current I2b. The fuel gauge 110 may determine the SOC of the battery device 200 based on the first SOC of the first battery BAT1 and the second SOC of the second battery BAT2.

In some embodiments, a program for performing the method including operations S110 to S150 may be stored in a computer-readable storage medium. A processor may execute the method by accessing the computer-readable storage medium. In an embodiment, the electronic device 10 may include a processor implemented in the IC 100. In an embodiment, the electronic device 10 may include a processor implemented outside the IC 100, and the processor may be, for example, an application processor (e.g., the AP 400 of FIG. 21).

FIG. 12 is a flowchart illustrating in more detail a method of operating an electronic device for determining an SOC of a battery, according to an embodiment. Referring to FIG. 12, a method of determining the SOC of the battery according to the present embodiment may correspond to an implementation example of the method illustrated in FIG. 11. Therefore, the description given above with reference to FIG. 11 may also be applied to the present embodiment. Hereinafter, the difference between the present embodiment and the embodiment of FIG. 11 will be described mainly.

In operation S130a, it is determined whether the difference between the measurement current I2a and the calculation current I2b is equal to or greater than a threshold value. If it is determined that the difference between the measurement current I2a and the calculation current I2b is less than the threshold value (S130a=No), operation S140a may be performed. In operation S140a, the calculation current I1 of the first battery BAT1 is calculated using the first battery parameter(s) and the first terminal voltage V1 of the first battery BAT1 (the measurable voltage across the first battery BAT1). For example, the fuel gauge 110 may calculate the calculation current I1 of the first battery BAT1 by applying the first battery parameter(s) and the first terminal voltage V1 of the first battery BAT1 to Equation 1, 3 or 5 described above.

On the other hand, if it is determined that the difference between the measurement current I2a and the calculation current I2b is equal to or greater than the threshold value (S130a=Yes), operation S130b may be performed. In operation S130b, the first battery parameter(s) is/are corrected to second battery parameter(s). In operation S140b, the calculation current I1 of the first battery BAT1 is calculated using the second battery parameter(s) and the first terminal voltage V1 of the first battery BAT1. For example, the fuel gauge 110 may calculate the calculation current I1 of the first battery BAT1 by applying the second battery parameter(s) and the first terminal voltage V1 of the first battery BAT1 to Equation 2, 4 or 6 described above. In operation S150, the SOC of the battery device 200 is determined.

FIG. 13 is a flowchart illustrating a method of operating an electronic device for determining an SOC of a battery, according to an embodiment. Referring to FIG. 13, a method of determining the SOC of the battery according to the present embodiment may include, for example, operations performed in time series in the fuel gauge 110 of the electronic device 10 of FIG. 1.

In operation S210, the first terminal voltage V1 of the first battery BAT1, the second terminal voltage V2 of the second battery BAT2 (the measurable voltage across the second battery BAT2), and the measurement current I2a of the second battery BAT2 are obtained. In operation S220, it is determined whether the first terminal voltage V1 and the second terminal voltage V2 are in a balanced state. For example, the fuel gauge 110 may determine whether the first terminal voltage V1 and the second terminal voltage V2 are the same or substantially the same such as within a predefined percentage (e.g., 1%) of one another. If it is determined that the first terminal voltage V1 and the second terminal voltage V2 are in a balanced state (S220=Yes), operation S230 may be performed. Otherwise (S220=No), operation S310 of FIG. 16 may be performed. Operation S220 will be described in detail with reference to FIGS. 14 and 15.

Figure 14:
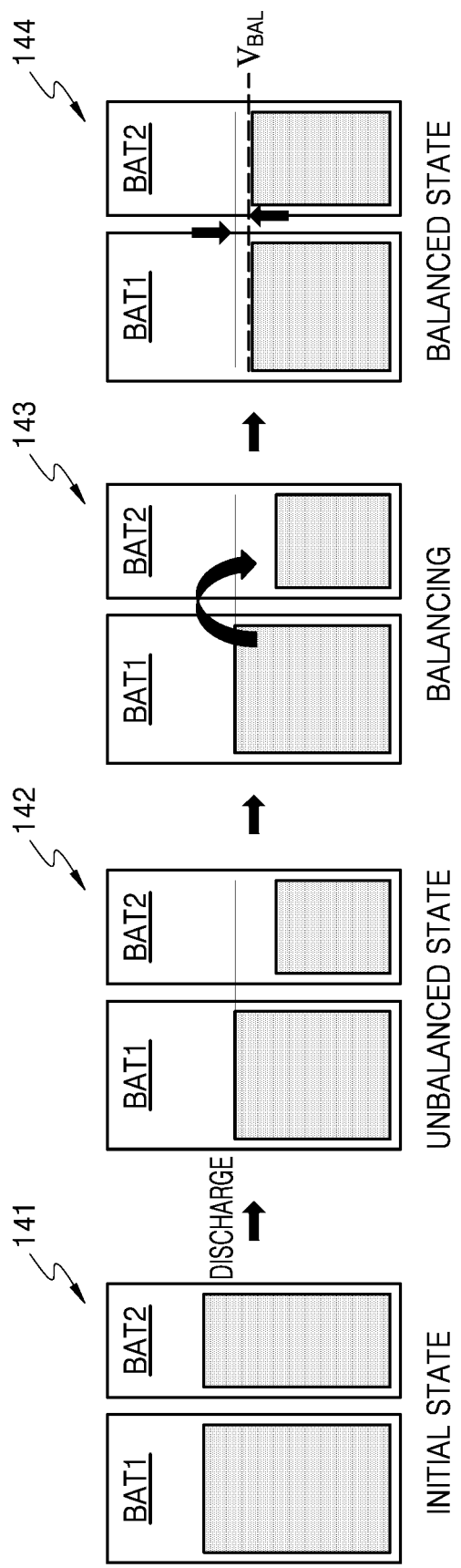
FIG. 14 illustrates a balancing operation for a first battery and a second battery, according to an embodiment.

FIG. 14 illustrates a balancing operation for first battery BAT1 and second battery BAT2, according to an embodiment.

Referring to FIG. 14, the first battery BAT1 and second battery BAT2 may correspond to, for example, the first battery BAT1 and second battery BAT2 included in the battery device 200 of FIG. 6. In an initial state 141, the first battery BAT1 and second battery BAT2 may be charged to the same voltage level. For example, in the discharge mode of the electronic device 10a illustrated in FIG. 9, the battery device 200 may provide the system current $I_{SYS}$ to the system load SL. In this case, the system current $I_{SYS}$ may be provided from the second battery BAT2. Accordingly, the voltage of the second battery BAT2 may drop faster than the voltage of the first battery BAT1 and the first battery BAT1 and the second battery BAT2 may reach an unbalanced state 142.

In a balancing operation section 143, a balancing circuit (e.g., the balancing circuit 130 in FIG. 9) may perform a balancing operation to transfer the energy of the first battery BAT1 to the second battery BAT2. Specifically, the balancing circuit 130 may provide the balancing current $I_{BAL}$ to the connection node ND between the first battery BAT1 and the second battery BAT2, thereby transferring the energy of the first battery BAT1 to the second battery BAT2. Accordingly, the first battery BAT1 and the second battery BAT2 may reach a balanced state 144 with the balanced voltage $V_{BAL}$.

Figure 15:
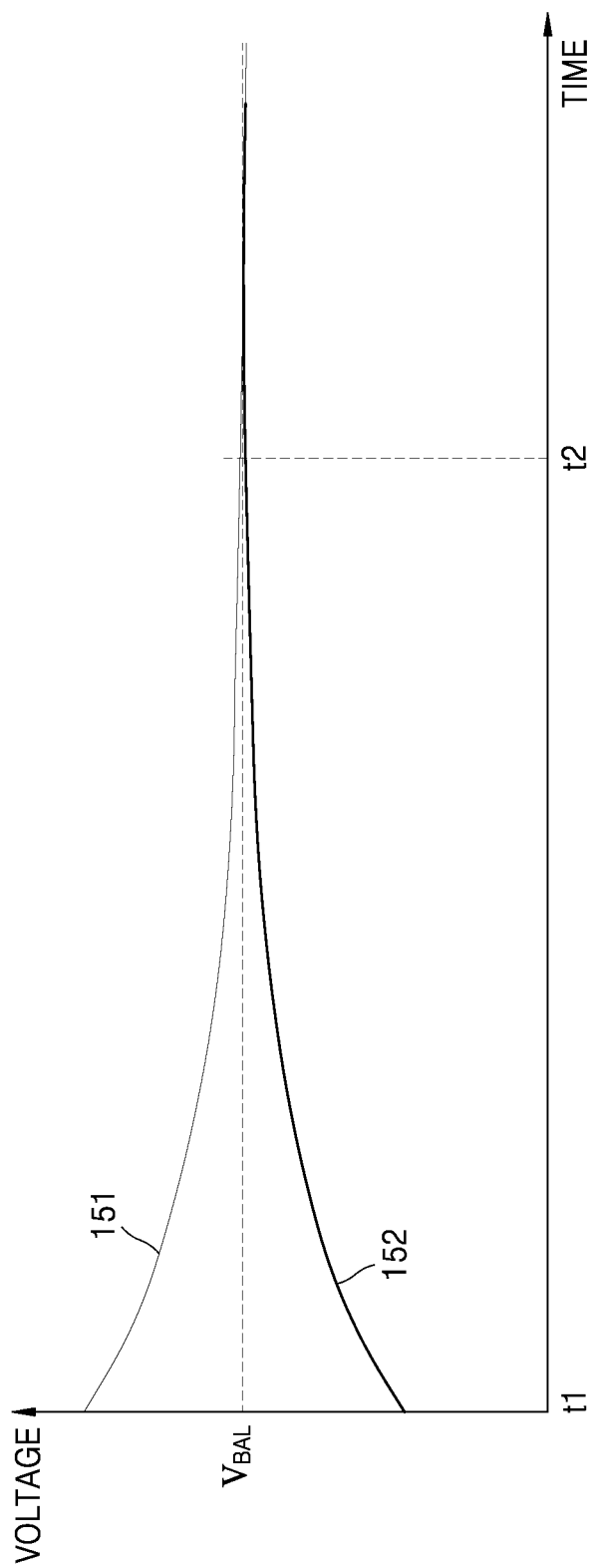
FIG. 15 is a graph showing voltage against time with respect to the first battery and the second battery, according to an embodiment.

FIG. 15 is a graph showing voltage against time with respect to the first battery BAT1 and the second battery tBAT2, according to an embodiment.

Referring to FIG. 15, the horizontal axis represents time and the vertical axis represents voltage. At a first time t1, a first terminal voltage 151 of the first battery BAT1 may be higher than a second terminal voltage 152 of the second battery BAT2. For example, the first time t1 may correspond to the unbalanced state 142 of FIG. 14. At a second time t2, the first terminal voltage 151 of the first battery BAT1 and the second terminal voltage 152 of the second battery BAT2 may be equal to the balanced voltage $V_{BAL}$. For example, the second time t2 may correspond to the balanced state 144 of FIG. 14. The time between the first time t1 and the second time t2 may correspond to the balancing operation section 143 of FIG. 14.

Referring back to FIG. 13, in operation S230, a common open circuit voltage of the first battery BAT1 and the second battery BAT2 is obtained. For example, the fuel gauge 110 may determine the balance voltage $V_{BAL}$ of FIG. 14 or 15 as a common open circuit voltage. In operation S240, the SOC of the battery device 200 is determined. For example, operations S230 and S240 may correspond to the case where the system load SL is not connected to the battery device 200.

Figure 16:
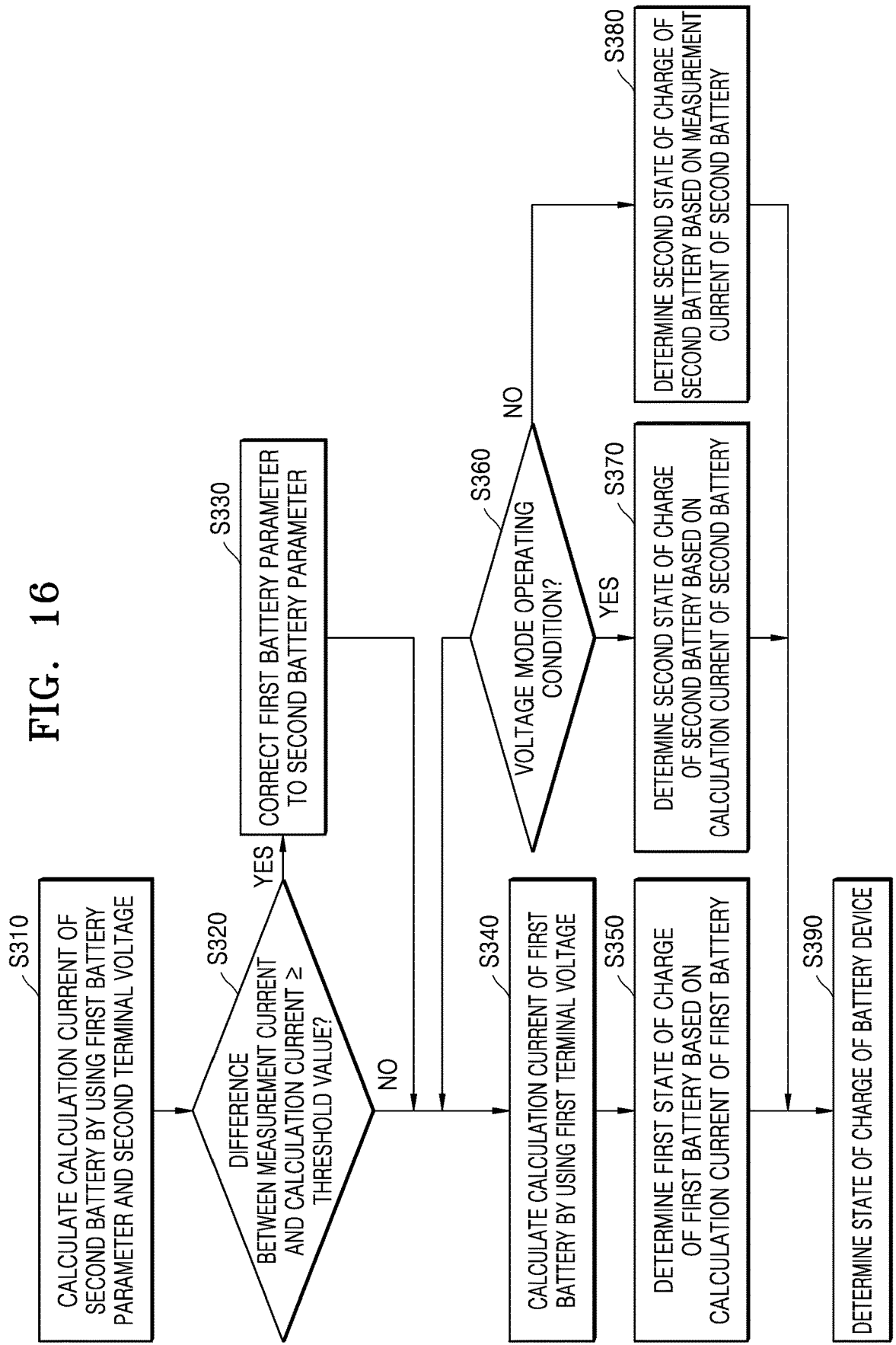
FIG. 16 is a flowchart illustrating a method of operating an electronic device for determining an SOC of a battery, according to an embodiment.

FIG. 16 is a flowchart illustrating a method of operating an electronic device for determining an SOC of a battery, according to an embodiment. Referring to FIG. 16, a method of determining the SOC of the battery according to the present embodiment may include operations performed after operation S220 of FIG. 13, and the operations may be performed, for example, in time series in the fuel gauge 110 of the electronic device 10 of FIG. 1.

In operation S310, the calculation current I2b of the second battery BAT2 is calculated using a first battery parameter(s) and the second terminal voltage V2 (the measurable voltage across the second battery BAT2). In operation S320, it is determined whether the difference between the measurement current I2a and the calculation current I2b is equal to or greater than a threshold value. If it is determined that the difference between the measurement current I2a and the calculation current I2b is equal to or greater than the threshold value (S320=Yes), operation S330 is performed. In operation S330, the first battery parameter(s) is/are corrected to second battery parameter(s). If it is determined that the difference between the measurement current I2a and the calculation current I2b is less than the threshold value (S320=No), operation S340 is performed.

In operation S340, the calculation current I1 of the first battery BAT1 is calculated using the first terminal voltage V1 of the first battery BAT1 (the measurable across the first battery BAT1). When the difference between the measurement current I2a and the calculation current I2b is equal to or greater than the threshold value, the second battery parameter(s) and the first terminal voltage V1 may be applied to Equation 2, 4, or 6 described above to thereby calculate the calculation current I1 of the first battery BAT1. On the other hand, when the difference between the measurement current I2a and the calculation current I2b is less than the threshold value, the first battery parameter(s) and the first terminal voltage V1 may be applied to Equation 1, 3, or 5 described above to thereby calculate the calculation current I1 of the first battery BAT1. In operation S350, the first SOC of the first battery BAT1 is determined based on the calculation current I1 of the first battery BAT1.

In operation S360, it is determined whether the second battery BAT2 is in a voltage mode operating condition. The voltage mode operating condition represents a condition for acquiring the calculation current I2b of the second battery BAT2 by using the second terminal voltage V2 of the second battery BAT2 and a battery parameter(s). If it is determined that the second battery BAT2 is in the voltage mode operating condition (S360=Yes), the second SOC of the second battery BAT2 is determined in operation S370 based on the calculation current I2b of the second battery BAT2. If it is determined that the second battery BAT2 is not in the voltage mode operating condition (S360=No), the second SOC of the second battery BAT2 is determined in operation S380 based on the measurement current I2a of the second battery BAT2. In operation S390, the SOC of the battery device 200 is determined.

Figure 17:
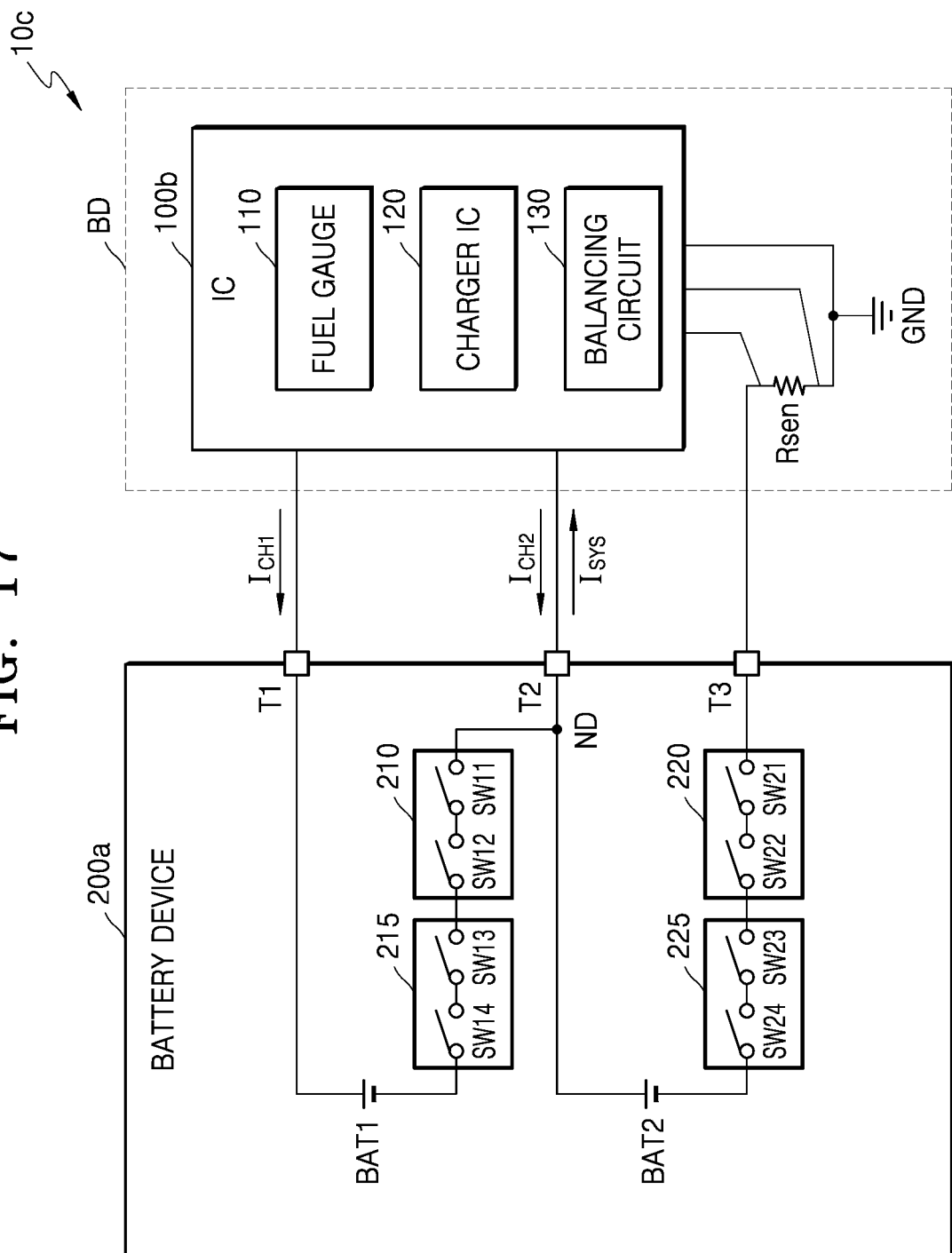
FIG. 17 illustrates a battery device according to an embodiment.

FIG. 17 illustrates a battery device 200a according to an embodiment.

Referring to FIG. 17, an electronic device 10c may include an IC 100b, a sense resistor Rsen, and the battery device 200a. The IC 100b may include a fuel gauge 110, a charger IC 120, and a balancing circuit 130. In some embodiments, the balancing circuit 130 may be implemented in the charger IC 120. The battery device 200a may include first battery BAT1 and second battery BAT2, first protection circuit 210 and first protection circuit 220, and second protection circuit 215 and second protection circuit 225.

The first protection circuit 210 and second protection circuit 215 may be connected in series between a second terminal T2 and a first battery BAT1. The first protection circuit 210 may include switches SW11 and SW12 and the second protection circuit 215 may include switches SW13 and SW14. The first protection circuit 220 and second protection circuit 225 may be connected in series between a third terminal T3 and a second battery BAT2. The first protection circuit 220 may include switches SW21 and SW22 and the second protection circuit 225 may include switches SW23 and SW24. For example, the switches SW11 to SW14 and SW21 to SW24 may be implemented as field effect transistors (FETs). The number of switches included in each of the first protection circuit 210, the second protection circuit 215, the first protection circuit 220 and the second protection circuit 225 may be variously changed according to embodiments. In some embodiments, at least one of the first protection circuit 210, the second protection circuit 215, the first protection circuit 220 and the second protection circuit 225 may include only one switch.

Figure 18:
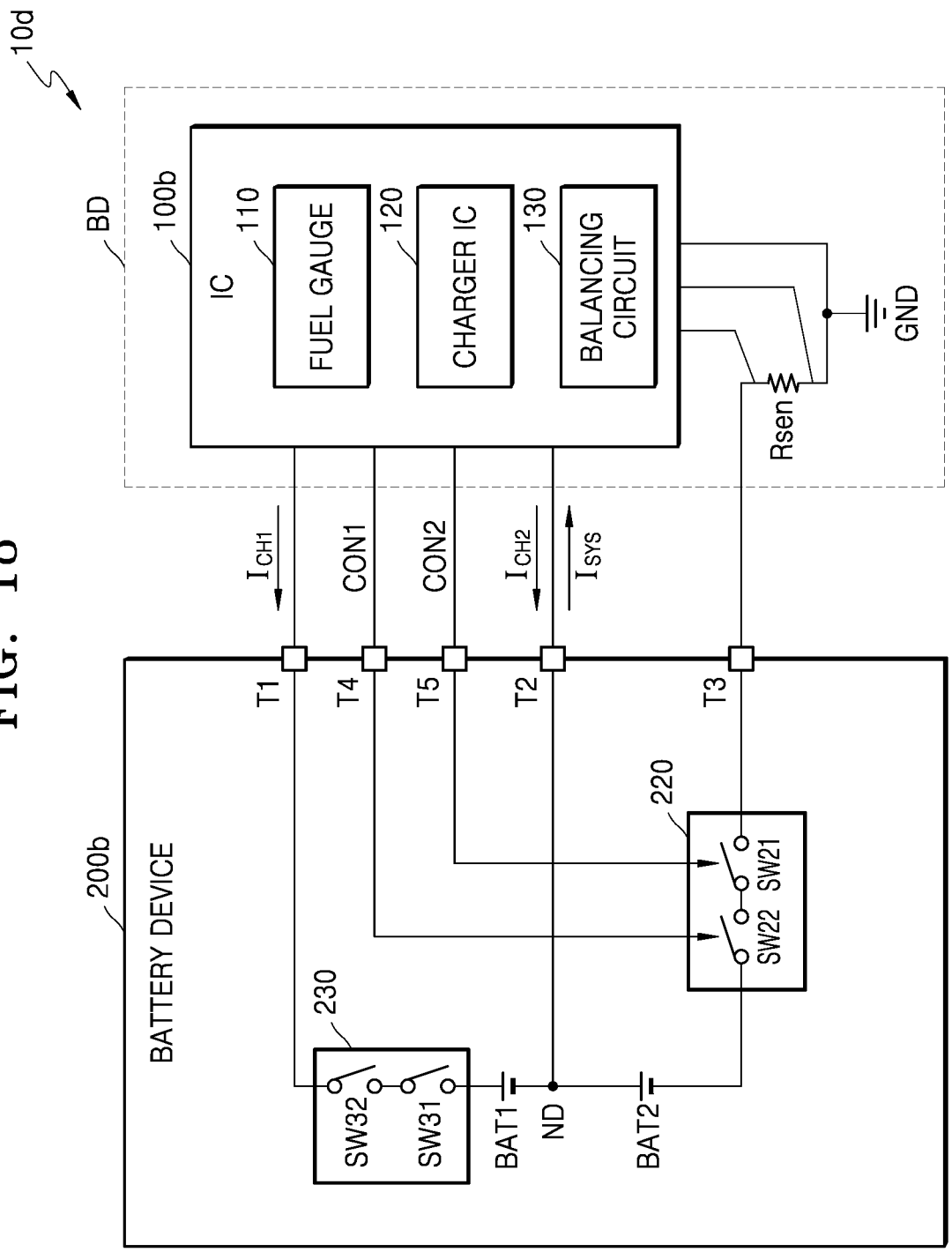
FIG. 18 illustrates a battery device according to an embodiment.

FIG. 18 illustrates a battery device 200b according to an embodiment.

Referring to FIG. 18, an electronic device 10d may include an IC 100b, a sense resistor Rsen, and the battery device 200b. The electronic device 10d may correspond to a modification of the electronic device 10c of FIG. 17 and the description given above with reference to FIG. 17 may be applied to the present embodiment, and thus, a repeated description will be omitted. The battery device 200b may include first battery BAT1 and second battery BAT2, a first protection circuit 220, and a second protection circuit 230.

The first protection circuit 220 may be connected between a third terminal T3 and the second battery BAT2 and may include switches SW21 and SW22. The second protection circuit 230 may be connected between a first terminal T1 and the first battery BAT1 and may include switches SW31 and SW32. For example, the switches SW21, SW22, SW31, and SW32 may be implemented as FETs. The number of switches included in each of the first protection circuit 220 and second protection circuit 230 may be variously changed according to embodiments. In some embodiments, at least one of the first protection circuit 220 and second protection circuit 230 may include only one switch. In some embodiments, the battery device 200b may further include a protection circuit between the first battery BAT1 and a connection node ND.

In addition, the battery device 200b may further include fourth terminal T4 and fifth terminal T5. The battery device 200b may receive a first control signal CON1 from the IC 100b through the fourth terminal T4 and receive a second control signal CON2 from the IC 100b through the fifth terminal T5. The first control signal CON1 may be a control signal for driving the switch SW22 and the second control signal CON2 may be a control signal for driving the switch SW21. In some embodiments, the battery device 200b may further receive control signals for driving the switches SW31 and SW32 included in the second protection circuit 230 from the IC 100b.

Figure 19:
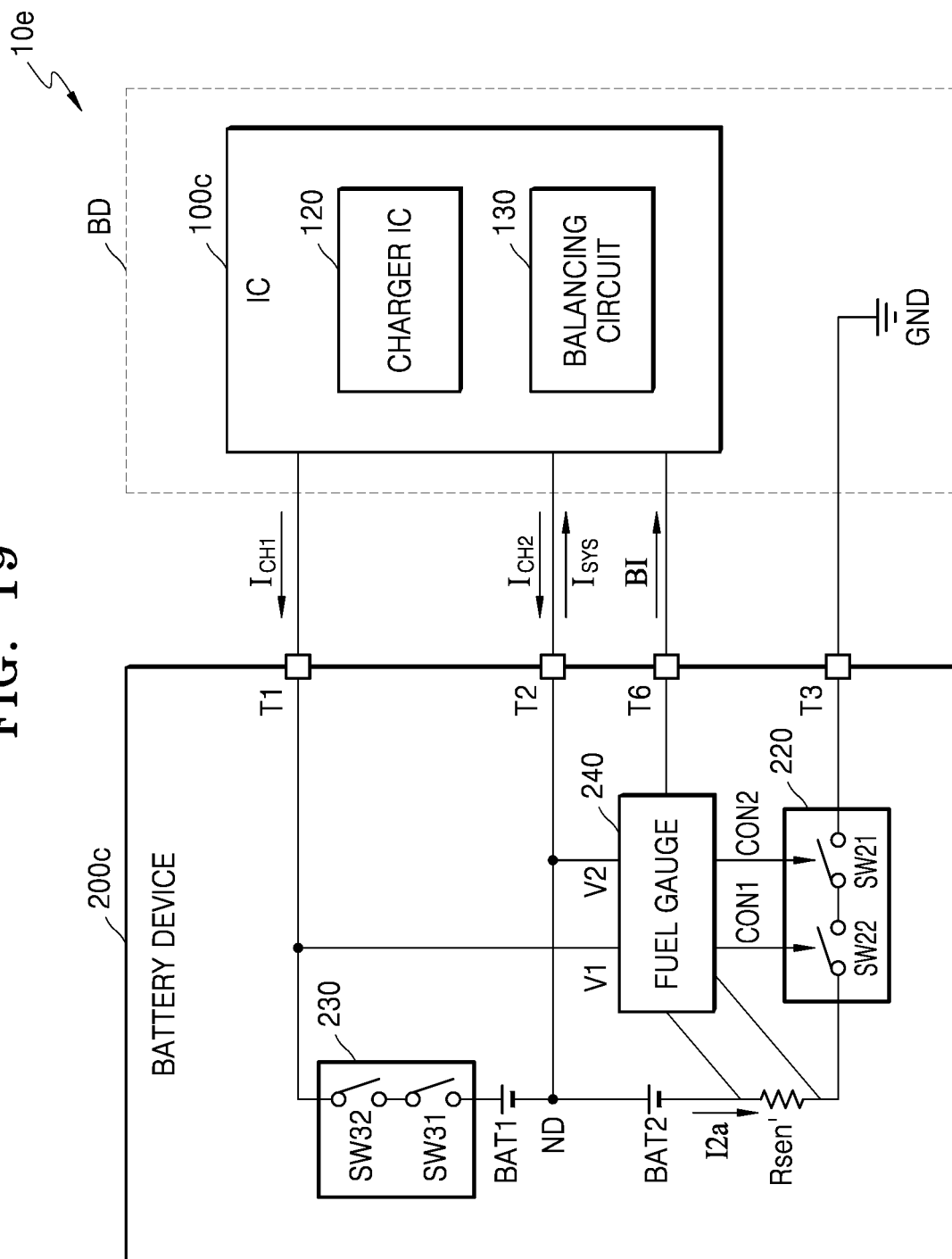
FIG. 19 illustrates a battery device according to an embodiment.

FIG. 19 illustrates a battery device 200c according to an embodiment.

Referring to FIG. 19, an electronic device 10e may include an IC 100c and the battery device 200c. The electronic device 10e may correspond to a modification of the electronic device 10d of FIG. 18 and the description given above with reference to FIG. 18 may be applied to the present embodiment, and thus, a repeated description will be omitted. The IC 100c may include a charger IC 120 and a balancing circuit 130. The battery device 200c may include first battery BAT1 and second battery BAT2, a first protection circuit 220, a second protection circuit 230, a fuel gauge 240, and a sense resistor Rsen'. Also, the battery device 200c may include first terminal T1, second terminal T2 third terminal T3 and a sixth terminal T6.

According to the present embodiment, the fuel gauge 240 and the sense resistor Rsen' may be arranged in the battery device 200c. The fuel gauge 240 may acquire a measurement current I2a of the second battery BAT2 by sensing a current flowing through the sense resistor Rsen'. Also, the fuel gauge 240 may sense a first terminal voltage V1 of the first battery BAT1 (the measurable voltage across the first battery BAT1) and a second terminal voltage V2 of the second battery BAT2.

In an embodiment, the fuel gauge 240 may provide battery information BI to the IC 100c through the sixth terminal T6. The battery information BI includes the measurement current I2a of the second battery BAT2, the first terminal voltage V1 of the first battery BAT1, and the second terminal voltage V2 of the second battery BAT2 (the measurable voltage across the second battery BAT2). Also, in an embodiment, the fuel gauge 240 may determine an SOC of the battery device 200c based on the measurement current I2a of the second battery BAT2, the first terminal voltage V1 of the first battery BAT1, and the second terminal voltage V2 of the second battery BAT2. The fuel gauge 240 may provide battery information BI including the SOC of the battery device 200c to the IC 100c through the sixth terminal T6.

The fuel gauge 240 may also generate a first control signal CON1 for driving a switch SW22 and a second control signal CON2 for driving a switch SW21. The fuel gauge 240 may control the operations of the switches SW22 and SW21 by providing the generated first control signal CON1 and second control signal CON2 to the switches SW22 and SW21, respectively. In some embodiments, the fuel gauge 240 may further generate control signals for driving switches SW31 and SW32 included in the second protection circuit 230.

Figure 20:
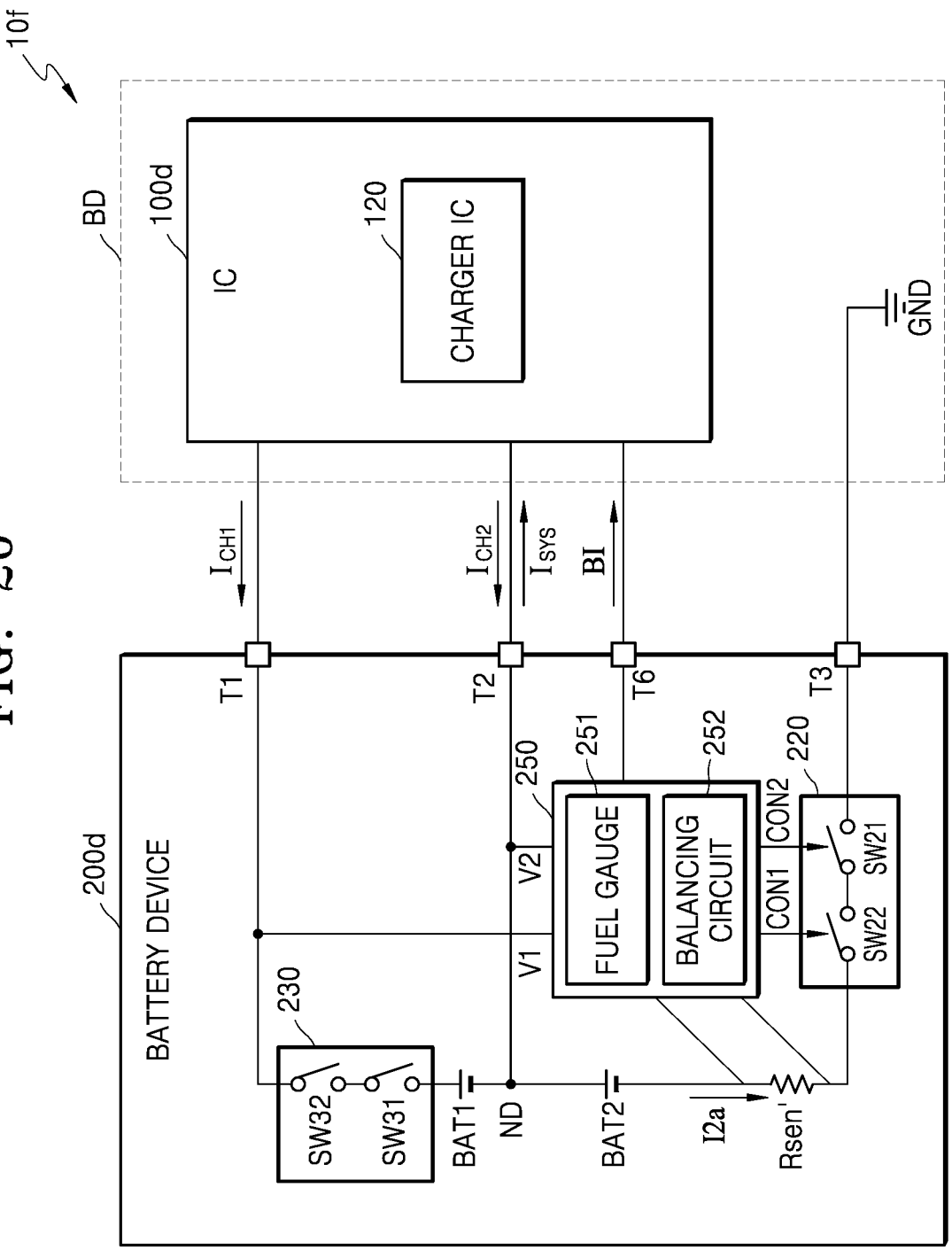
FIG. 20 illustrates a battery device according to an embodiment.

FIG. 20 illustrates a battery device 200d according to an embodiment.

Referring to FIG. 20, an electronic device 10f may include an IC 100d and the battery device 200d. The electronic device 10f may correspond to a modification of the electronic device 10e of FIG. 19 and the description given above with reference to FIG. 19 may be applied to the present embodiment, and thus, a repeated description will be omitted. The IC 100d may include a charger IC 120. The battery device 200d may include first battery BAT1 and second battery BAT2, a first protection circuit 220, a second protection circuit 230, a fuel gauge 251, a balancing circuit 252, and a sense resistor Rsen'.

According to the present embodiment, the fuel gauge 251, the balancing circuit 252, and the sense resistor Rsen' may be arranged in the battery device 200d. The fuel gauge 251 may be implemented substantially similar to the fuel gauge 240 of FIG. 19. The balancing circuit 252 may balance a first terminal voltage V1 of the first battery BAT1 and a second terminal voltage V2 of the second battery BAT2. In an embodiment, the fuel gauge 251 and the balancing circuit 252 may be implemented as a single integrated circuit 250. However, the configurations of the fuel gauges and balancing circuits according to the present disclosure are not limited thereto, and the fuel gauge 251 and the balancing circuit 252 may be implemented as different integrated circuits, respectively.

The fuel gauge 251 may acquire a measurement current I2a of the second battery BAT2 by sensing a current flowing through the sense resistor Rsen'. The fuel gauge 251 may sense the first terminal voltage V1 of the first battery BAT1 and the second terminal voltage V2 of the second battery BAT2. In an embodiment, the fuel gauge 251 may provide battery information BI to the IC 100d through a sixth terminal T6. The battery information BI includes the measurement current I2a of the second battery BAT2, the first terminal voltage V1 of the first battery BAT1, and the second terminal voltage V2 of the second battery BAT2. Also, in an embodiment, the fuel gauge 251 may determine an SOC of the battery device 200d based on the measurement current I2a of the second battery BAT2, the first terminal voltage V1 of the first battery BAT1, and the second terminal voltage V2 of the second battery BAT2. The fuel gauge 251 may provide battery information BI including the SOC of the battery device 200d to the IC 100d through the sixth terminal T6.

Figure 21:
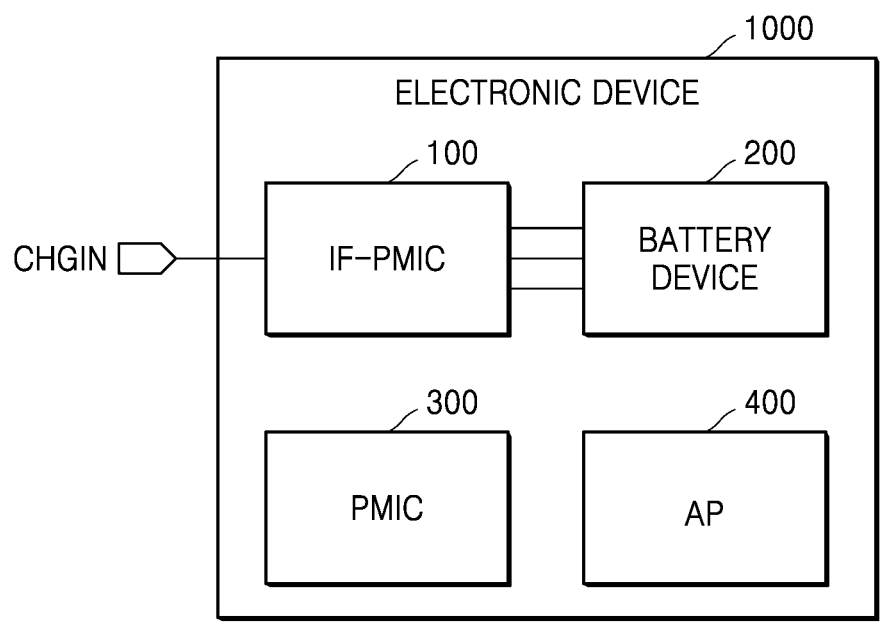
FIG. 21 is a block diagram illustrating an electronic device according to an embodiment.

FIG. 21 is a block diagram illustrating an electronic device 1000 according to an embodiment.

Referring to FIG. 21, the electronic device 1000 may include an IC 100, a battery device 200, a PMIC 300, and an AP 400 (application processor). For example, the IC 100 may be an IF-PMIC. The IC 100 may be implemented according to various embodiments illustrated in FIGS. 1 to 20. The battery device 200 may be a three-terminal battery including a first battery and a second battery connected in series and a first terminal, a second terminal and a third terminal. The first terminal may be connected to a high voltage node of the first battery. The second terminal may be connected to a connection node between the first battery and the second battery. The third terminal may be connected to a low voltage node of the second battery. The battery device 200 may be implemented according to various embodiments illustrated in FIGS. 1 to 20.

The PMIC 300 may receive a battery voltage and manage power required for driving the AP 400. In addition, the PMIC 300 may be implemented to generate or manage voltages required for internal components of the electronic device 1000. According to embodiments, the electronic device 1000 may include multiple PMICs each including the PMIC 300. In an embodiment, the PMIC 300 may receive the battery voltage from the battery device 200. In an embodiment, the PMIC 300 may receive a system voltage via the IC 100 that is an IF-PMIC. In an embodiment, the PMIC 300 may directly receive an input voltage CHGIN.

The AP 400 may control overall operations of the electronic device 1000. In an embodiment, the AP 400 may control the IC 100. For example, the AP 400 may control the operation of a fuel gauge (e.g., the fuel gauge 110 in FIG. 1) included in the IC 100 and may correct one or more battery parameter(s). For example, the AP 400 may control the IC 100 in a first charge mode, a second charge mode, a discharge mode, or a battery-only mode. In an embodiment, when the electronic device 1000 is connected to a TA, the AP 400 may communicate with the TA and adjust the input voltage CHGIN output from the TA. In an embodiment, the AP 400 may be implemented as a system-on-chip that includes one or more intellectual properties (IP).

An electronic device according to the present disclosure may be connected to a three-terminal battery including a first battery and a second battery connected in series, measure a current flowing in a second battery through a sense resistor connected in series to the second battery, and determine whether to correct one or more battery parameter(s) based on the measured current. In addition, even if the electronic device does not include a sense resistor serially connected to the first battery, the electronic device may accurately calculate a current flowing in the first battery by using the battery parameter(s) or corrected battery parameter(s). Therefore, even if the electronic device may not measure the current flowing in the first battery, the electronic device may accurately calculate an SOC of the first battery and thus may efficiently improve the accuracy of an SOC of the three-terminal battery.

While the inventive concept(s) of the present disclosure have been particularly shown and described with reference to embodiments thereof, it will be understood that various changes in form and details may be made therein without departing from the spirit and scope of the following claims.

What is claimed is:

1. An electronic device for determining a state of charge of a battery device that includes a first battery and a second battery connected in series, the electronic device comprising:
    a sense resistor configured to be connected in series to the second battery; and
    a fuel gauge configured to determine the state of charge of the battery device based on a first terminal voltage of the first battery, a first calculation current of the first battery, a second terminal voltage of the second battery, and a measurement current of the second battery measured through the sense resistor,
    wherein the fuel gauge is further configured to calculate a second calculation current of the second battery by using a first battery parameter of an equivalent circuit model of the second battery and the second terminal voltage, correct the first battery parameter to a second battery parameter when a difference between the measurement current and the second calculation current is greater than or equal to a threshold value, and calculate the first calculation current by using the first terminal voltage and the first battery parameter or the second battery parameter.

2. The electronic device of claim 1, wherein the fuel gauge is configured to determine a first state of charge of the first battery based on the first calculation current of the first battery, determine a second state of charge of the second battery based on the second calculation current or the measurement current of the second battery, and determine the state of charge of the battery device based on the first state of charge and the second state of charge.

3. The electronic device of claim 1, wherein, when the first terminal voltage and the second terminal voltage do not reach a balanced state, the fuel gauge is configured to determine the state of charge of the battery device based on the second calculation current or based on the measurement current and the first calculation current.

4. The electronic device of claim 1, wherein, when the first terminal voltage and the second terminal voltage reach a balanced state, the fuel gauge is configured to determine a voltage level of the balanced state of the first terminal voltage and the second terminal voltage as a common open circuit voltage of the first battery and the second battery and determine the state of charge of the battery device based on the common open circuit voltage.

5. The electronic device of claim 1, wherein the fuel gauge is configured to calculate the first calculation current by using the second battery parameter and the first terminal voltage when the difference between the measurement current and the second calculation current is greater than or equal to the threshold value, and to calculate the first calculation current by using the first battery parameter and the first terminal voltage when the difference between the measurement current and the second calculation current is less than the threshold value.

6. The electronic device of claim 1, wherein the battery device further includes a first terminal connected to a high voltage node of the first battery, a second terminal connected to a connection node between the first battery and the second battery, and a third terminal connected to a low voltage node of the second battery,
    wherein the sense resistor is configured to be connected between the third terminal and a ground terminal.

7. The electronic device of claim 6, further comprising:
    a first charger configured to be connected between an input voltage terminal and the first terminal and to provide a first charging current to the first terminal by using an input voltage received from the input voltage terminal in a first charge mode; and
    a second charger configured to be connected to the second terminal and to provide a second charging current to the second terminal by using the input voltage received from the input voltage terminal in a second charge mode.

8. The electronic device of claim 1, further comprising:
    a balancing circuit configured to balance the first terminal voltage and the second terminal voltage.

9. A method of operating an electronic device for determining a state of charge of a battery device including a first battery and a second battery connected in series, the method comprising:
    obtaining a measurement current of the second battery, measured through a sense resistor serially connected to the second battery;
    calculating a calculation current of the second battery by using a first battery parameter of an equivalent circuit model of the second battery and a second terminal voltage of the second battery;
    correcting the first battery parameter to a second battery parameter when a difference between the measurement current and the calculation current is greater than or equal to a threshold value;
    calculating a current of the first battery by using a first terminal voltage of the first battery and the first battery parameter or the second battery parameter; and
    determining the state of charge of the battery device based on the current of the first battery and the measurement current of the second battery or the calculation current of the second battery.

10. The method of claim 9, wherein the determining of the state of charge comprises:
    determining a first state of charge of the first battery based on the current of the first battery;
    determining a second state of charge of the second battery based on the measurement current or the calculation current of the second battery; and
    determining the state of charge of the battery device based on the first state of charge and the second state of charge.

11. The method of claim 9, further comprising:
    determining a voltage level of a balanced state of the first terminal voltage and the second terminal voltage as a common open circuit voltage of the first battery and the second battery when the first terminal voltage and the second terminal voltage reach the balanced state; and
    determining the state of charge of the battery device based on the common open circuit voltage.

12. The method of claim 9, wherein the calculating of the current of the first battery comprises:
   calculating the current by using the second battery parameter and the first terminal voltage when the difference between the measurement current and the calculation current is greater than or equal to the threshold value; and
   calculating the current by using the first battery parameter and the first terminal voltage when the difference between the measurement current and the calculation current is less than the threshold value.

13. The method of claim 9, wherein the battery device further includes a first terminal connected to a high voltage node of the first battery, a second terminal connected to a connection node between the first battery and the second battery, and a third terminal connected to a low voltage node of the second battery, wherein the sense resistor is connected between the third terminal and a ground terminal,
   the method further comprising: before the obtaining of the measurement current or after the determining of the state of charge of the battery device,
   providing, by a first charger, a first charging current to the first terminal by using an input voltage received from an input voltage terminal in a first charge mode, the first charger being included in the electronic device and being connected between the input voltage terminal and the first terminal; and
   providing, by a second charger, a second charging current to the second terminal by using the input voltage received from the input voltage terminal in a second charge mode, the second charger being included in the electronic device and being connected between the input voltage terminal and the second terminal.

14. A non-transitory computer-readable storage medium storing a program for performing the method of claim 9.

15. A battery device connectable to an electronic device, the battery device comprising:
   a first battery and a second battery connected in series;
   a first terminal connected to a high voltage node of the first battery;
   a second terminal connected to a connection node between the first battery and the second battery; and
   a third terminal connected to a low voltage node of the second battery,
   wherein the battery device is configured to receive a first charging current from the electronic device through the first terminal in a first charge mode, receive a second charging current from the electronic device through the second terminal in a second charge mode, and provide a system current to the electronic device through the second terminal in a discharge mode, and
   wherein a state of charge of the battery device is determined based on a first terminal voltage of the first battery, a first calculation current of the first battery, a second terminal voltage of the second battery, and a measurement current of the second battery,
   a second calculation current of the second battery is calculated by using a first battery parameter of an equivalent circuit model of the second battery and the second terminal voltage of the second battery, so that the first battery parameter is corrected to a second battery parameter when a difference between the measurement current of the second battery and the second calculation current of the second battery is greater than or equal to a threshold value, and
   the first calculation current of the first battery is calculated by using the first terminal voltage of the first battery and the first battery parameter or the second battery parameter.

16. The battery device of claim 15, further comprising:
a sense resistor located between the low voltage node of the second battery and the third terminal,
   wherein the measurement current of the second battery is measured through the sense resistor.

17. The battery device of claim 16, further comprising:
a fuel gauge configured to determine the state of charge of the battery device by measuring a current flowing in the second battery through the sense resistor as the measurement current and by sensing the first terminal voltage of the first battery and the second terminal voltage of the second battery.

18. The battery device of claim 16, further comprising:
a balancing circuit configured to balance the first terminal voltage of the first battery and the second terminal voltage of the second battery.

19. The battery device of claim 15, further comprising:
a protection circuit located between the low voltage node of the second battery and the third terminal.

20. The battery device of claim 19, further comprising:
at least one fourth terminal configured to receive, from the electronic device, a control signal for driving the protection circuit.

* * * * *